(12) United States Patent
Kim et al.

(10) Patent No.: US 12,009,303 B2
(45) Date of Patent: Jun. 11, 2024

(54) INTEGRATED CIRCUIT SEMICONDUCTOR DEVICE

(71) Applicant: Samsung Electronics Co., Ltd., Suwon-si (KR)

(72) Inventors: Jaechoon Kim, Incheon (KR); Seunggeol Ryu, Seoul (KR); Kyungsuk Oh, Seongnam-si (KR); Keungbeum Kim, Hwaseong-si (KR); Eonsoo Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 409 days.

(21) Appl. No.: 17/374,713

(22) Filed: Jul. 13, 2021

(65) Prior Publication Data

US 2022/0130761 A1 Apr. 28, 2022

(30) Foreign Application Priority Data

Oct. 28, 2020 (KR) ........................ 10-2020-0141453

(51) Int. Cl.
*H01L 23/528* (2006.01)
*H01L 23/00* (2006.01)
(Continued)

(52) U.S. Cl.
CPC .......... *H01L 23/5286* (2013.01); *H01L 23/36* (2013.01); *H01L 23/481* (2013.01);
(Continued)

(58) Field of Classification Search
None
See application file for complete search history.

(56) References Cited

U.S. PATENT DOCUMENTS 7,541,644 B2 6/2009 Hirano et al.
8,048,794 B2 11/2011 Knickerbocker
(Continued)

OTHER PUBLICATIONS

M. O. Hossen, et al., "Power Delivery Network (PDN) Modeling for Backside-PDN Configurations With Buried Power Rails and \$\mu\$ TSVs," Jan. 2020, pp. 11-17, vol. 67, No. 1, IEEE Transactions on Electron Devices.

*Primary Examiner* — Telly D Green
(74) *Attorney, Agent, or Firm* — Muir Patent Law, PLLC

(57) ABSTRACT

An integrated circuit semiconductor device includes a substrate having a first surface and a second surface opposite the first surface; a rail through via passing between the first surface and the second surface of the substrate; a cell-level portion arranged on the first surface and comprising a buried rail connected to the rail through via, a local conductive interconnect, a cell via connected to the local conductive interconnect, and a transistor connected to the local conductive interconnect; a signal wiring-level portion arranged on the cell-level portion and comprising a plurality of upper multi-layer interconnect layers connected to the local conductive interconnect via the cell via and upper vias connecting the upper multi-layer interconnect layers to each other; a dummy substrate arranged on the signal wiring-level portion; a bonding-level portion arranged between the signal wiring-level portion and the dummy substrate and bonding the signal wiring-level portion to the dummy substrate, and comprising a bonding pad connected to the upper via; a power delivery network-level portion arranged under the second surface of the substrate and comprising a plurality of lower multi-layer interconnect layers connected to the rail through via and lower vias connecting the lower multi-layer interconnect layers to each other; and an external connection terminal arranged under the power delivery network-level
(Continued)

portion and connected to the lower multi-layer interconnect layers.

20 Claims, 19 Drawing Sheets

(51) Int. Cl.
  *H01L 23/36* (2006.01)
  *H01L 23/48* (2006.01)
  *H01L 23/522* (2006.01)
(52) U.S. Cl.
  CPC .......... *H01L 23/5226* (2013.01); *H01L 24/08* (2013.01); *H01L 2224/08145* (2013.01)

(56) References Cited

U.S. PATENT DOCUMENTS

| | | | |
|---|---|---|---|
| 8,426,258 B2 | 4/2013 | Molin et al. | |
| 8,482,118 B2 | 7/2013 | Mohan et al. | |
| 9,167,692 B2* | 10/2015 | Shimizu | H01L 21/486 |
| 9,666,562 B2 | 5/2017 | Law et al. | |
| 10,546,917 B1* | 1/2020 | Tsai | H01L 21/3083 |
| 11,145,657 B1* | 10/2021 | Or-Bach | H01L 21/823475 |
| 11,393,758 B2* | 7/2022 | Cheah | H01L 25/0655 |
| 11,444,068 B2* | 9/2022 | Song | H01L 24/80 |
| 11,862,618 B2* | 1/2024 | Lee | H01L 25/50 |
| 2002/0113288 A1 | 8/2002 | Clevenger et al. | |
| 2006/0087029 A1* | 4/2006 | Imanaka | H01L 23/49822 |
| | | | 257/723 |
| 2006/0289932 A1* | 12/2006 | Ahn | H01L 27/0207 |
| | | | 257/334 |
| 2007/0035030 A1* | 2/2007 | Horton | H01L 23/49822 |
| | | | 257/E23.079 |
| 2011/0049673 A1* | 3/2011 | Chakravarti | H01L 27/0688 |
| | | | 257/532 |
| 2012/0112352 A1* | 5/2012 | Chi | H01L 23/481 |
| | | | 257/784 |
| 2012/0146193 A1 | 6/2012 | Stuber et al. | |
| 2012/0292777 A1* | 11/2012 | Lotz | H01L 23/5286 |
| | | | 438/459 |
| 2014/0021584 A1* | 1/2014 | Tu | H10B 12/50 |
| | | | 257/532 |
| 2014/0154858 A1* | 6/2014 | Farmer | H01G 4/33 |
| | | | 438/381 |
| 2014/0252544 A1* | 9/2014 | Li | H01G 4/38 |
| | | | 257/532 |
| 2014/0327109 A1* | 11/2014 | Weng | H01L 29/945 |
| | | | 257/534 |
| 2015/0102459 A1* | 4/2015 | Lai | H01L 22/34 |
| | | | 257/532 |
| 2016/0379960 A1* | 12/2016 | Huang | H01L 24/00 |
| 2017/0323920 A1* | 11/2017 | Kumar | H01L 27/1464 |
| 2018/0330992 A1* | 11/2018 | DeLaCruz | H01L 23/60 |
| 2018/0331094 A1* | 11/2018 | DeLaCruz | H01L 25/0657 |
| 2019/0148342 A1* | 5/2019 | Hu | H01L 25/105 |
| | | | 257/659 |
| 2019/0148351 A1* | 5/2019 | Chen | H01L 21/76898 |
| | | | 257/678 |
| 2019/0378556 A1* | 12/2019 | Lim | G11C 5/025 |
| 2021/0118618 A1* | 4/2021 | Shin | H01G 4/005 |
| 2021/0175192 A1* | 6/2021 | Mueller | H01L 24/03 |
| 2021/0407942 A1* | 12/2021 | Yu | H01L 25/03 |
| 2022/0216185 A1* | 7/2022 | Kao | H01L 25/50 |
| 2022/0262778 A1* | 8/2022 | Yu | H01L 24/08 |

* cited by examiner

INTEGRATED CIRCUIT SEMICONDUCTOR DEVICE

CROSS-REFERENCE TO RELATED APPLICATION

This application is based on and claims priority under 35 U.S.C. § 119 to Korean Patent Application No. 10-2020-0141453, filed on Oct. 28, 2020, in the Korean Intellectual Property Office, the disclosure of which is incorporated by reference herein in its entirety.

BACKGROUND

The inventive concept relates to an integrated circuit semiconductor device, and more particularly, to an integrated circuit semiconductor device having reduced power delivery noise and improved heat transfer characteristics.

As the level of integration of integrated circuit semiconductor devices increases, power delivery noise may occur therein. Also, with the increased level of integration of integrated circuit semiconductor devices, more heat is generated. Accordingly, a new structure for improving power delivery noise and heat transfer characteristics in an integrated circuit semiconductor device would be beneficial.

SUMMARY

Aspects of the inventive concept provide an integrated circuit semiconductor device for reducing power delivery noise and improving heat transfer characteristics.

According to some embodiments, an integrated circuit semiconductor device includes a substrate having a first surface and a second surface opposite the first surface; a rail through via passing between the first surface and the second surface of the substrate; a cell-level portion arranged on the first surface and including a buried rail connected to the rail through via, a local conductive interconnect, a cell via connected to the local conductive interconnect, and a transistor connected to the local conductive interconnect; a signal wiring-level portion arranged on the cell-level portion and comprising an upper multi-layer interconnect layer connected to the local interconnect via the cell via; a heat transfer line connected to the upper multi-layer interconnect layer and formed in the cell-level portion and the signal wiring-level portion; a dummy substrate arranged on the signal wiring-level portion; a bonding-level portion arranged between the signal wiring-level portion and the dummy substrate and bonding the signal wiring-level portion to the dummy substrate; a power delivery network-level portion arranged under the second surface of the substrate and comprising a lower multi-layer interconnect layer connected to the rail through via; and an external connection terminal arranged under the power delivery network-level portion and connected to the lower multi-layer interconnect layer.

According to some embodiments, an integrated circuit semiconductor device includes a first substrate having a first surface and a second surface opposite the first surface; a first through via passing from the first surface to the second surface of the first substrate; a heat transfer through via arranged apart from the first through via and passing from the first surface to the second surface of the first substrate; a cell-level portion arranged on the first surface of the first substrate and comprising a buried conductor connected to the first through via, a local conductive interconnect, a cell via connected to the local conductive interconnect, and a transistor connected to the local conductive interconnect; a signal wiring-level portion arranged on the cell-level portion and comprising a plurality of upper multi-layer interconnect layers connected to the local conductive interconnect via the cell via and upper vias connecting the upper multi-layer interconnect layers to each other; a heat transfer line connected to the heat transfer through via and the upper multi-layer interconnect layers, the heat transfer line formed in the cell-level portion and the signal wiring-level portion; a second substrate arranged on the signal wiring-level portion; a bonding-level portion arranged between the signal wiring-level portion and the second substrate and bonding the signal wiring-level portion to the second substrate, and comprising a bonding pad connected to the upper via; a power delivery network-level portion arranged under the second surface of the first substrate and comprising a plurality of lower multi-layer interconnect layers connected to the first through via and lower vias connecting the lower multi-layer interconnect layers to each other; and an external connection terminal arranged under the power delivery network-level portion and connected to the lower multi-layer interconnect layers.

According to some embodiments, an integrated circuit semiconductor device includes a substrate having a first surface and a second surface opposite the first surface; a rail through via passing between the first surface and the second surface of the substrate; a cell-level portion arranged on the first surface and comprising a buried rail connected to the rail through via, a local conductive interconnect, a cell via connected to the local conductive interconnect, and a transistor connected to the local conductive interconnect; a signal wiring-level portion arranged on the cell-level portion and comprising a plurality of upper multi-layer interconnect layers connected to the local conductive interconnect via the cell via and upper vias connecting the upper multi-layer interconnect layers to each other; a dummy substrate arranged on the signal wiring-level portion; a bonding-level portion arranged between the signal wiring-level portion and the dummy substrate and bonding the signal wiring-level portion to the dummy substrate, and comprising a bonding pad connected to the upper via; a power delivery network-level portion arranged under the second surface of the substrate and comprising a plurality of lower multi-layer interconnect layers connected to the rail through via and lower vias connecting the lower multi-layer interconnect layers to each other; and an external connection terminal arranged under the power delivery network-level portion and connected to the lower multi-layer interconnect layers.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the attached drawings. The inventive concept may be implemented by one of the embodiments or also by combining at least two of the embodiments. Therefore, the inventive concept shall not be interpreted by limiting the same to a single embodiment. Hereinafter, the expression "connected" may indicate "physically and/or electrically connected."

Figure 1:
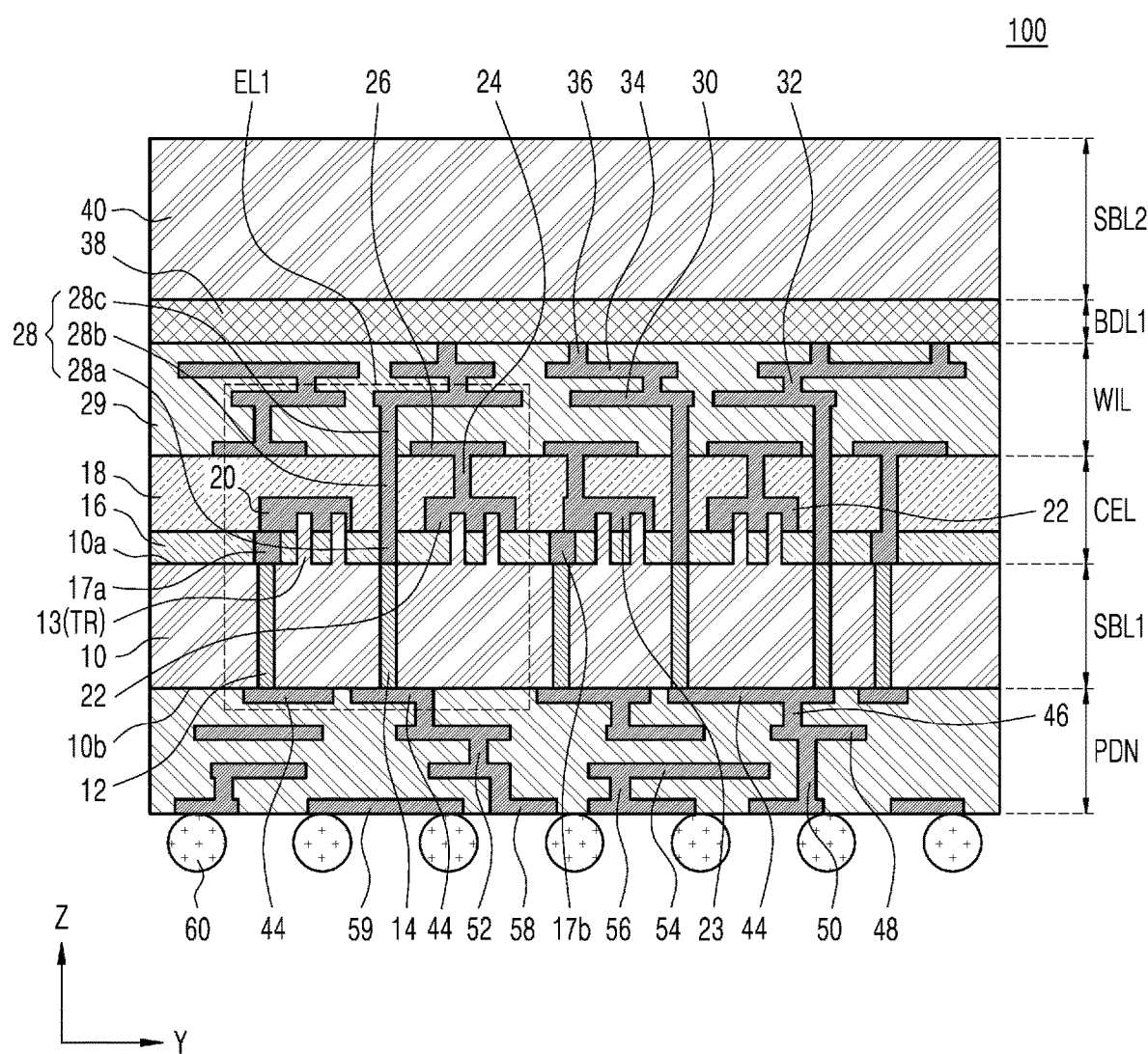
FIG. 1 is a cross-sectional view of a main portion of an integrated circuit semiconductor device according to an embodiment.
Figure 2:
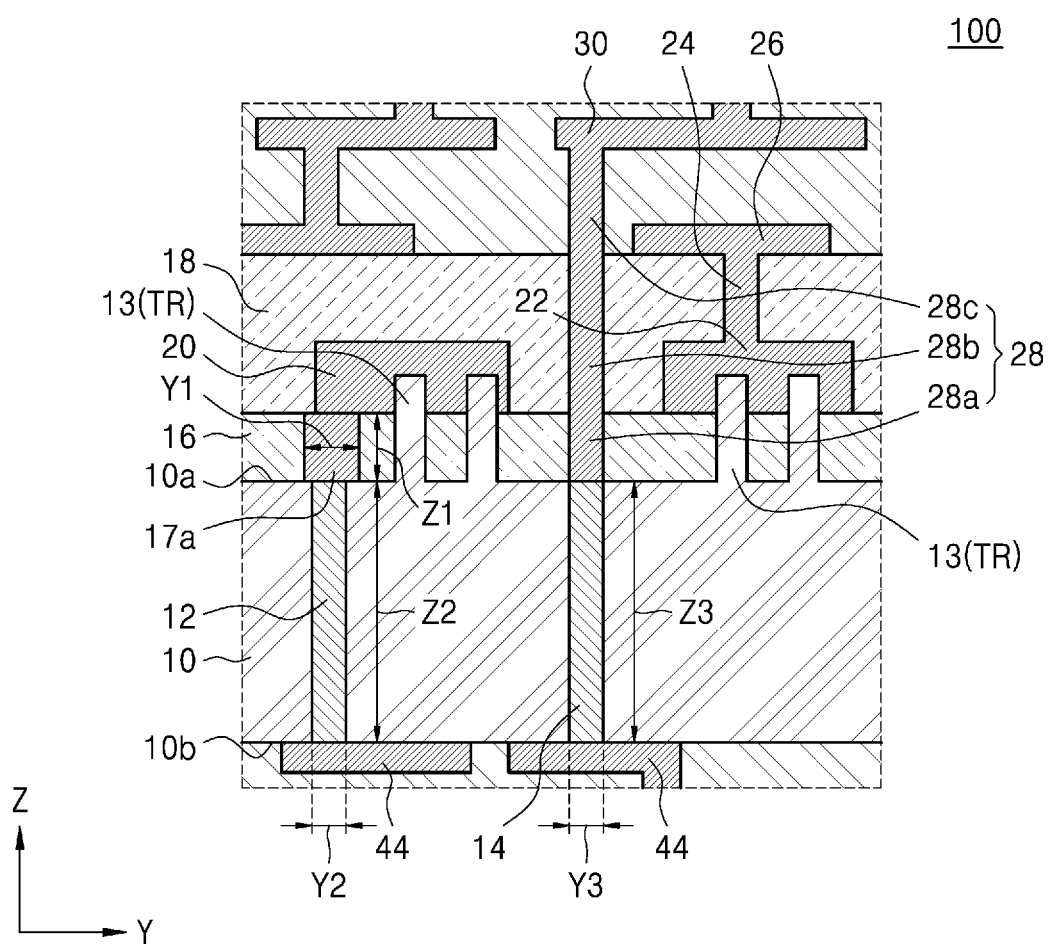
FIG. 2 is an enlarged partial view of FIG. 1.

FIG. 1 is a cross-sectional view of a main portion of an integrated circuit semiconductor device 100 according to an embodiment, and FIG. 2 is an enlarged partial view of FIG. 1.

In detail, FIG. 2 is an enlarged view of region "EL1" of FIG. 1. The integrated circuit semiconductor device 100 may include a substrate 10 having a first surface 10a and a second surface 10b opposite the first surface 10a. The integrated circuit semiconductor device 100 may also be referred to as an integrated circuit semiconductor package.

The substrate 10 may be a silicon substrate. The first surface 10a may be a front surface or an external surface, and the second surface 10b may be a back surface or a rear surface. The first surface 10a may also be described as a top surface or active surface, and the second surface 10b may also be described as a bottom surface or inactive surface. For example a bottom of the integrated circuit semiconductor device 100 may be where external connection terminals 60 are located, and a top of the integrated circuit semiconductor device 100 may an exposed surface of dummy substrate 40 (describe in greater detail later). Spatially relative terms, such as "beneath," "below," "lower," "above," "upper," "top," "bottom," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. The substrate 10 may have a certain thickness in a Z-direction. In some embodiments, the substrate 10 may have a thickness of several hundreds µm or less. In some embodiments, the substrate 10 may have a thickness of several µm. The substrate 10 may correspond to a first substrate portion SBL1.

A rail through via 12 may pass through between the first surface 10a and the second surface 10b of the substrate 10. For example, the rail through via 12 may pass from the first surface 10a to the second surface 10b of the substrate 10, and in some embodiments, may be formed of a continuous single piece. The rail through via 12 may have a height Z2 in a third direction (Z-direction) perpendicular to the second surface 10b of the substrate 10. The rail through via 12 may have a width (or diameter) Y2 in a second direction (Y-direction) parallel to the second surface 10b of the substrate 10. In some embodiments, the width (or diameter) Y2 of the rail through via 12 may be several µm, for example, 10 µm or less.

The rail through via 12 may also be referred to as a rail through silicon via or rail through substrate via. The rail through via 12 may also be referred to as a rail conductive via. The rail through via 12 may include or may be formed of an electrically-conductive material (which may also be a heat-conductive material) such as a metal, for example, tungsten.

A heat transfer through via 14 may be located in the substrate 10 and apart from the rail through via 12. The heat transfer through via 14 may pass between the first surface 10a and the second surface 10b of the substrate 10. For example, the heat transfer through via 12 may pass from the first surface 10a to the second surface 10b of the substrate 10, and in some embodiments, may be formed of a continuous single piece. The heat transfer through via 14 may have a height Z3 in the third direction (Z-direction) perpendicular to the second surface 10b of the substrate 10.

The heat transfer through via 14 may have a width (or diameter) Y3 in the second direction (Y-direction) parallel to the second surface 10b of the substrate 10. In some embodiments, the width Y3 and the height Z3 of the heat transfer through via 14 may be respectively equal to the width (or diameter) Y2 and the height Z2 of the rail through via 12. In some embodiments, the width (or diameter) Y3 of the heat transfer through via 14 may be several µm, for example, 10 µm or less.

The heat transfer through via 14 may also be referred to as a heat transfer through silicon via or heat transfer through substrate via. The heat transfer through via 14 may also be referred to as a heat transfer conductive via. The heat transfer through via 14 may include or be formed of a heat-conductive material (which may also be an electrically-conductive material) such as a metal, for example, tungsten. The substrate 10, the rail through via 12, and the heat transfer through via 14 may correspond to the substrate portion SBL1 located in the third direction (Z-direction). The terms "heat-conductive," "thermally-conductive," or "heat transfer" used in connection with components or materials are intended to refer to components or materials that are typically known as good heat conductors or known to have utility for transferring heat, or components or materials having similar heat conducting properties as those components or materials. These terms do not apply to a particular component or material simply because it provides incidental heat conduction.

A cell portion CEL may be located on the first surface 10a of the substrate 10. The cell portion CEL may include buried rails 17a and 17b connected to the rail through via 12, local interconnects 20, 22, and 23, a cell via 24, and a transistor TR connected to the local interconnects 20, 22, and 23.

The transistor TR may be a fin field-effect transistor (FinFET). The cell portion CEL may be a front end of line (FEOL) portion of a manufacturing process of the integrated circuit semiconductor device 100. The cell portion CEL may be a portion where an active element is formed.

The buried rails 17a and 17b may be buried by a device isolation insulating layer 16. The buried rails 17a and 17b may include or be formed of a conductive material, and may be referred to as buried conductors. In some embodiments, the buried rails 17a and 17b may include or may be formed of a silicon doped with an impurity or a metal such as tungsten or ruthenium. The buried rails 17a and 17b may each be part of a power rail, a ground rail, and a signal rail. Components described as power, ground, or signal components are configured to connect to a power, ground, or signal source. In addition, certain power, ground, or signal components connected to such a power, ground, or signal source are configured to transfer power, ground, or signal voltages to an integrated circuit (e.g., to one or more transistors). In some embodiments, the device isolation insulating layer 16 may be a silicon oxide layer.

The buried rails 17a and 17b may have a height Z1 in the third direction (Z-direction). The buried rails 17a and 17b may have a width (or diameter) Y1 in the second direction (Y-direction). In some embodiments, the width (or diameter) Y1 of the buried rails 17a and 17b in the second direction (Y-direction) may be greater than or equal to the width (or diameter) Y2 of the rail through via 12 in the Y-direction. In FIG. 2, a width (or diameter) Y1 of the buried rails 17a and 17b in the second direction (Y-direction) that is greater than the width (or diameter) Y2 of the rail through via 12 in the Y-direction is illustrated.

Among the local interconnects 20, 22, and 23, the local interconnects 20 and 23 may be connected to the buried rails 17a and 17b and the local interconnect 22 may not be connected to the buried rails 17a and 17b. The local interconnect 20 connected to the buried rail 17a may be a power or ground interconnect. The local interconnect 22 not connected to the buried rails 17a and 17b and the local interconnect 23 connected to the buried rail 17b may be signal local interconnects. The local interconnects 20, 22, and 23 may be insulated from each other via an interlayer insulating layer 18. The local interconnects 20, 22, and 23, may also be described as single-level interconnects, or cell-level interconnects, which may have a structure contained, for example, within the cell-level portion CEL. The local interconnects 20, 22, and 23 may connect and communicate signals between an active region of a transistor to a conductive line connected to the transistor. A material that forms the local interconnects 20, 22, and 23 may be a conductive material, for example a metal such as tungsten, aluminum, or copper. The local interconnects 20, 22, and 23, may be described as local conductive interconnects. In some embodiments, the interlayer insulating layer 18 may be a silicon oxide layer.

The local interconnects 22 and 23 may be connected to the cell via 24 formed in the interlayer insulating layer 18. The cell via 24 may be connected to an upper multi-layer interconnect layer 26 that is in a lowermost portion from among upper multi-layer interconnect layers 26, 30, and 34. Each of the upper multi-layer interconnect layers 26, 30, and 34 may extend horizontally and may be formed of a conductive material, for example a metal such as tungsten, aluminum, or copper. The cell via 24 may extend vertically and may be formed of a conductive material, for example a metal such as tungsten. In the cross-sectional views of FIGS. 1 and 2, an active fin 13 constituting the transistor TR is illustrated. The local interconnects 20, 22, and 23 may surround a portion of an upper portion of the active fin 13. A configuration of the transistor TR will be described in further detail later.

In the cell portion CEL, first and second portions 28a and 28b of a heat transfer line 28 that is connected to the upper multi-layer interconnect layer 30 in a middle portion, from among the upper multi-layer interconnect layers 26, 30, and 34, may be formed. The first portion 28a of the heat transfer line 28 may be connected to (e.g., directly connected to) the heat transfer through via 14. The heat transfer line 28 may have a function of transferring heat generated in the cell portion CEL upward or downward. The heat transfer line 28 may include a metal, for example, tungsten.

A signal wiring portion WIL may be located above the cell portion CEL. The signal wiring portion WIL may include the upper multi-layer interconnect layers 26, 30, and 34 connected to the local interconnects 22 and 23 via the cell via 24 and upper vias 32 and 36 connecting the upper multi-layer interconnect layers 26, 30, and 34 to each other. The signal wiring portion WIL may include an upper interconnect insulating layer 29 insulating the upper multi-layer interconnect layers 26, 30, and 34 from the upper vias 32 and 36. The upper vias 32 and 36 may extend vertically and may be formed of a conductive material, such as a metal, which may be the same material as the material that forms the upper multi-layer interconnect layers 26, 30, and 34 and/or the cell via 24.

In some embodiments, the upper interconnect insulating layer 29 may be a silicon oxide layer. The signal wiring portion WIL may perform a function of transmitting a signal to the transistor TR of the cell portion CEL. The signal wiring portion WIL may be a back end of line (BEOL) portion of a manufacturing process of the integrated circuit semiconductor device 100.

A third portion 28c of the heat transfer line 28 may be located in the signal wiring portion WIL. The third portion 28c of the heat transfer line 28 may be connected (e.g., directly connected) to one of the upper multi-layer interconnect layers 26, 30, and 34. In FIG. 1, for convenience, the third portion 28c of the heat transfer line 28 is illustrated as being connected to the upper multi-layer interconnect layer 30 in the middle portion from among the upper multi-layer interconnect layers 26, 30, and 34. However, third portions 28c of other heat transfer lines 28 may be instead connected to a different one of the upper multi-layer interconnect layers 26, 30, or 34 (e.g., 26 or 34).

A dummy substrate 40 may be located on the signal wiring portion WIL with a first bonding portion BDL1 therebetween. The first bonding portion BDL1 may be a portion that is between the signal wiring portion WIL and the dummy substrate 40 and bonds the signal wiring portion WIL to the dummy substrate 40. In some embodiments, the first bonding portion BDL1 may be a silicon oxide layer or a SiCN layer. The dummy substrate 40 may correspond to a second substrate portion SBL2. The dummy substrate 40 may be referred to as an auxiliary substrate or a carrier substrate. The dummy substrate 40 may be, for example, a silicon substrate. The dummy substrate, in some embodiments, does not include an integrated circuit formed thereon. The dummy substrate may be, for example, a silicon substrate without any doping, etching, or other processing performed thereon.

A power delivery network portion PDN may be located under the second surface 10*b* of the substrate 10. The power delivery network portion PDN may include lower multi-layer interconnect layers 44, 48, 54, 58, and 59 connected to the rail through via 12 and lower vias 46, 50, 52, and 56 connecting the lower multi-layer interconnect layers 44, 48, 54, 58, and 59 to each other. The lower multi-layer interconnect layers 44, 48, 54, 58, and 59 may extend horizontally and may be formed of a conductive material, which may be the same as the material that forms upper multi-layer interconnect layers 26, 30, and 34. The lower vias 46, 50, 52, and 56 may extend vertically, and may be formed of a conductive material, which may be the same as the material that forms the upper vias 32 and 36. The power delivery network portion PDN may be a BEOL portion of a manufacturing process of the integrated circuit semiconductor device 100.

In the power delivery network portion PDN, the lower multi-layer interconnect layers 44, 48, 54, 58, and 59 connected to the heat transfer through via 14 and the lower vias 46, 50, 52, and 56 may be formed. An external connection terminal 60 connected to the lower multi-layer interconnect layers 44, 48, 54, 58, and 59 may be located under the power delivery network portion PDN. The external connection terminal 60 may include a solder ball. The external connection terminal 60 may be a power terminal, a ground terminal or a signal terminal. The first substrate portion SBL1, cell portion CEL, signal wiring portion WIL, first bonding portion BDL1, second substrate portion SBL2*a* and power delivery network portion PDN may each also be referred to as regions, or sections, or as a first substrate-level portion, cell-level portion, signal wiring-level portion, first bonding-level portion, second substrate-level portion, and power delivery network-level portion.

In FIG. 1, for convenience, the lower multi-layer interconnect layers 44, 48, 54, 58, and 59 and the lower vias 46, 50, 52, and 56 of the power delivery network portion PDN are illustrated as being connected to both the rail through vias 12 and the heat transfer through vias 14. However, lower multi-layer interconnect layers and lower vias of the power delivery network portion PDN may also be separately provided for each of the rail through via 12 and the heat transfer through via 14.

In the integrated circuit semiconductor device 100 configured as described above, the cell portion CEL and the signal wiring portion WIL are formed on the first surface 10*a* of the substrate 10 and the power delivery network portion PDN is formed on the second surface 10*b* of the substrate 10. Therefore, in the integrated circuit semiconductor device 100, the signal wiring portion WIL and the power delivery network portion PDN may be separated, thereby reducing power delivery noise.

In addition, in the integrated circuit semiconductor device 100, the heat transfer through via 14 may be formed in the substrate 10, and the heat transfer line 28 may be formed in the cell portion CEL and the signal wiring portion WIL, thus easily discharging heat generated in the cell portion CEL to the outside and improving heat transfer characteristics, accordingly.

As a result, according to the integrated circuit semiconductor device 100 of the inventive concept, power deliver noise may be reduced and heat transfer characteristics may be improved. Accordingly, the device reliability of the integrated circuit semiconductor device 100 according to the inventive concept may be improved.

Figure 3:
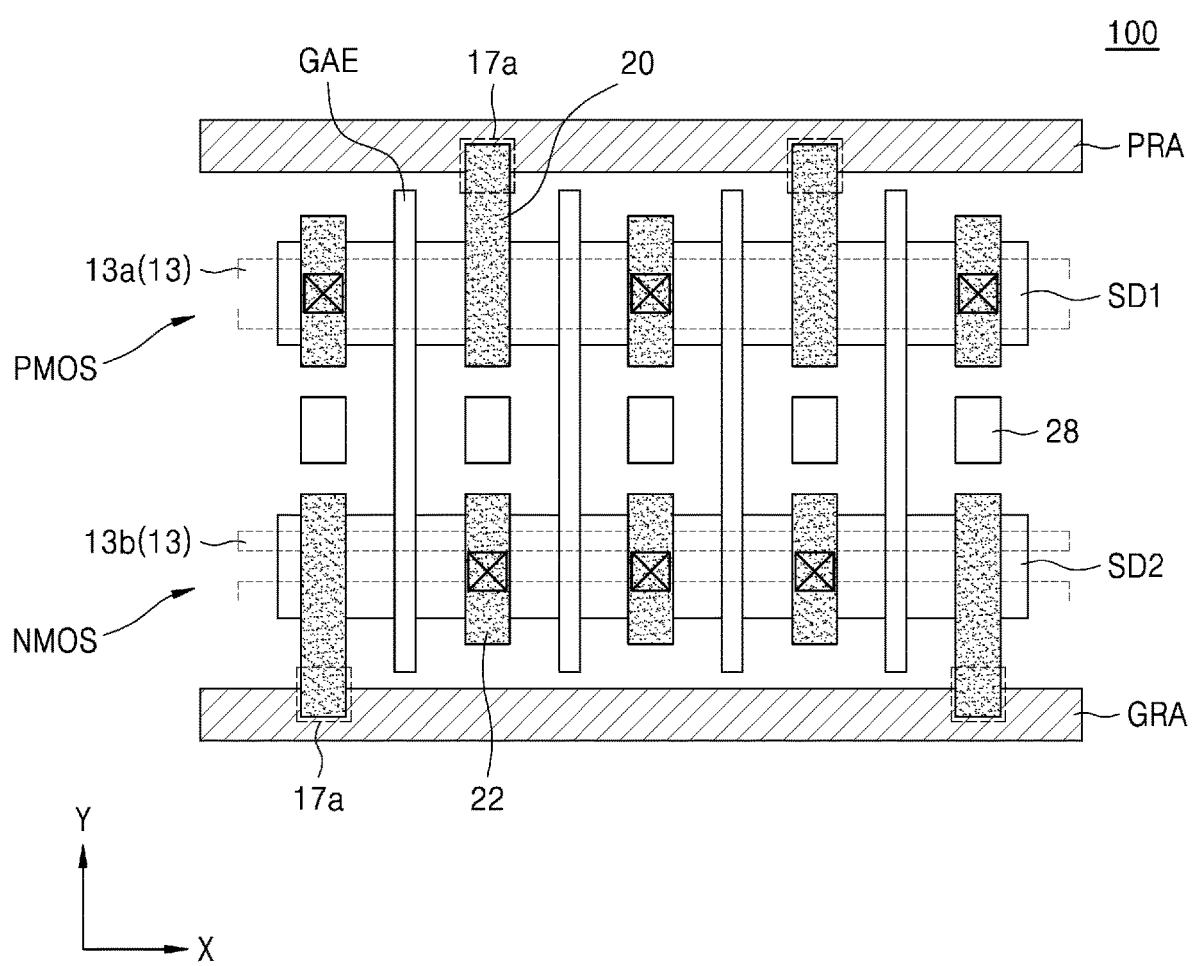
FIG. 3 is a partial layout diagram of the integrated circuit semiconductor device of FIG. 1 according to an embodiment.

FIG. 3 is a partial layout diagram of the integrated circuit semiconductor device 100 of FIG. 1.

In detail, FIG. 3 is a partial layout diagram for describing the transistor TR of the integrated circuit semiconductor device 100 of FIG. 1. FIG. 3 is a partial layout diagram at a level of the cell portion CELL of the integrated circuit semiconductor device 100 of FIG. 1. The integrated circuit semiconductor device 100 may be a layout diagram including finFETs (or fin-type transistors) as an example of active elements. However, the inventive concept is not limited to the layout diagram of FIG. 3.

The integrated circuit semiconductor device 100 may include a complementary metal-oxide semiconductor (CMOS) transistor including a P-type MOS (PMOS) transistor and an N-type MOS (NMOS) transistor. In the integrated circuit semiconductor device 100, PMOS transistors and NMOS transistors may be repeatedly arranged in the second direction (Y-direction).

P-type and N-type MOS transistors may include a plurality of respective active fins 13*a* and 13*b* extending in the first direction (X-direction). The active fins 13*a* and 13*b* may include P-type active fins 13*a* and N-type active fins 13*b*. Gate lines GAE crossing the active fins 13*a* and 13*b* in the second direction (Y-direction) perpendicular to the first direction (X-direction), for example, four gate lines GAE, may be arranged. The active fins 13*a* and 13*b* may be grown from a surface of the substrate 10 (see FIGS. 1 and 2), for example via epitaxial growth, or may be formed by an etching process.

A plurality of source and drain regions SD1 and SD2 may be arranged on two (e.g., opposite) sides of each of the gate lines GAE in the first direction (X-direction) perpendicular to the second direction (Y-direction). The source and drain regions SD1 and SD2 may include a P-type source and drain region SD1 and an N-type source and drain region SD2.

Some of the source and drain regions SD1 and SD2 may be connected to a power rail line PRA or a ground rail line GRA extending in the first direction via the local interconnect 20 and the buried rail 17*a*. For example, some of the P-type source and drain regions SD1 may be connected to the power rail line PRA extending in the first direction (X-direction) via the local interconnect 20 and the buried rail 17*a*. The buried rail 17*a* may also be described as a plug, or a rail plug. The power rail line PRA and the ground rail line GRA may each include or be formed of a conductive material, for example a metal such as tungsten or ruthenium, or of silicon doped with an impurity. As an example, some portions of the lower multi-layer interconnect layers 44, 48, 54, or 59 may correspond to power rail lines PRA, and some other portions of the lower multi-layer interconnect layers 44, 48, 54, or 59 may correspond to ground rail lines GRA. Alternatively, the power rail lines PRA and ground rail lines GRA may be formed at the same level as the device insulation layer 16, to be connected to the buried rail 17*a* or 17*b*. For example, a power rail line PRA or ground rail line GRA may extend in the first direction (X-direction) to be directly connected to the buried rail 17*a* or 17*b* at the level of the device insulation layer 16. The buried rail 17*a* or 17*b* may be considered to be part of the power rail line PRA or ground rail line GRA. Similarly, the power rail line PRA or ground rail line GRA in this example may be considered to be part of a buried rail. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Some of the N-type source and drain regions SD2 may be connected to the ground rail line GRA extending in the first direction (X-direction) via the local interconnect 20 and the buried rail 17a. Some of the source and drain regions SD1 and SD2 may be connected to the upper multi-layer interconnect layers 26, 30, and 34 (FIG. 1) via the local interconnect 22.

In the integrated circuit semiconductor device 100, the heat transfer line 28 may be arranged between the local interconnects 20 and 22 in the second direction (Y-direction). The heat transfer lines 28 may be arranged apart from each other in the first direction (X-direction). The heat transfer line 28 may be connected to the upper multi-layer interconnect layers 26, 30, and 34 (FIG. 1).

Figure 4:
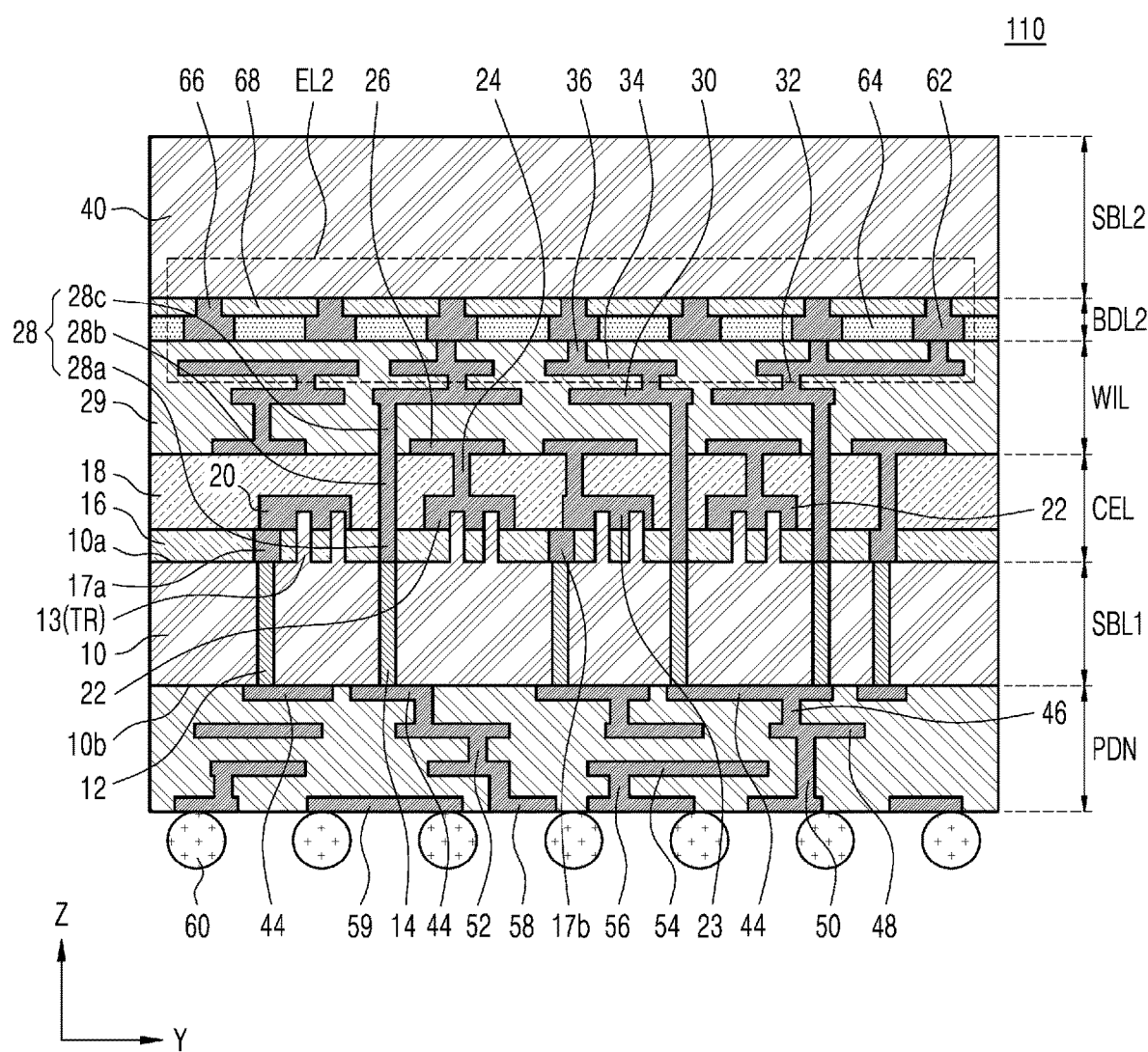
FIG. 4 is a cross-sectional view of a main portion of an integrated circuit semiconductor device according to an embodiment.
Figure 5:
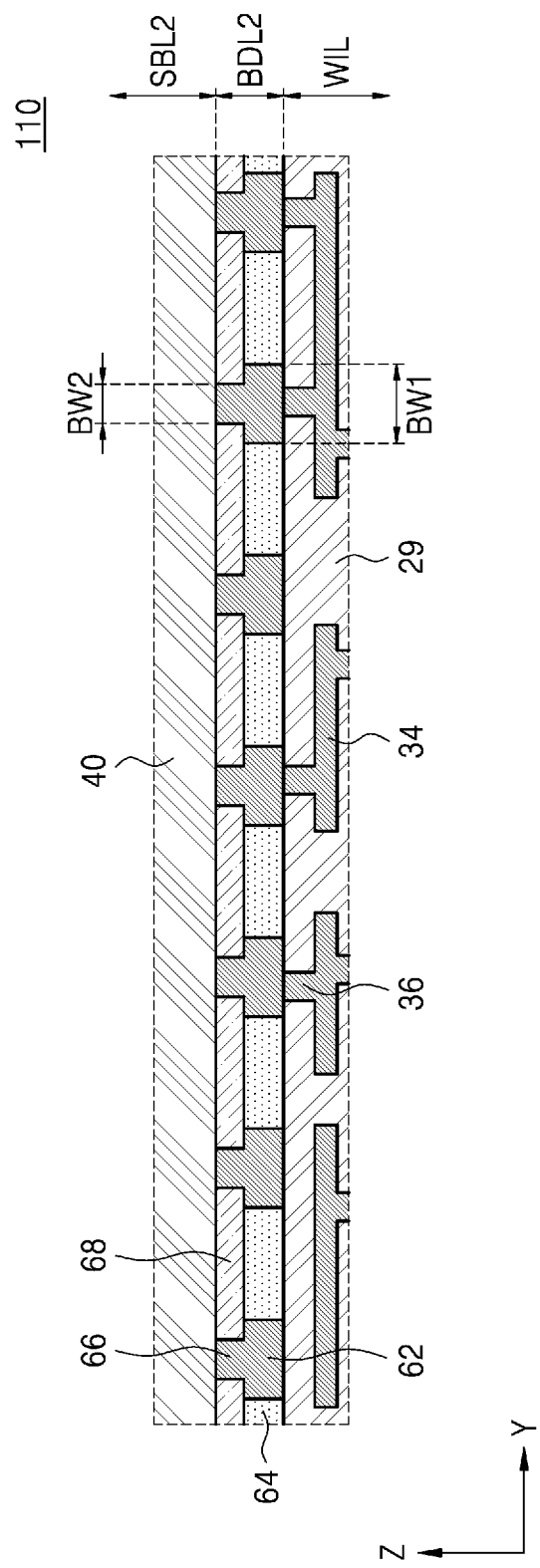
FIG. 5 is an enlarged partial view of FIG. 4.

FIG. 4 is a cross-sectional view of a main portion of an integrated circuit semiconductor device 110 according to an embodiment, and FIG. 5 is an enlarged partial view of FIG. 4.

In detail, FIG. 5 is an enlarged view of region "EL2" of FIG. 4. The integrated circuit semiconductor device 110 may be identical to the integrated circuit semiconductor device 100 of FIGS. 1 through 3 except that the integrated circuit semiconductor device 110 includes a second bonding portion BDL2. In FIGS. 4 and 5, like reference numerals as those of FIGS. 1 through 3 may denote like elements. In FIGS. 4 and 5, details that are identical to those provided with reference to FIGS. 1 through 3 will be briefly described or description thereof may be omitted.

The integrated circuit semiconductor device 110 may include the second bonding portion BDL2 bonding the signal wiring portion WIL to the dummy substrate 40 between the signal wiring portion WIL and the dummy substrate 40. The second bonding portion BDL2 may include, on the signal wiring portion WIL, a first bonding pad 62 connected to the upper multi-layer interconnect layers 26, 30, and 34 and the upper vias 32 and 36 and a second bonding pad 66 that is on a lower surface of the dummy substrate 40 and bonded to the first bonding pad 62.

In some embodiments, a width (or diameter) BW1 and a width (or diameter) BW2 of the first bonding pad 62 and the second bonding pad 66 in the second direction (Y-direction) may be several tens of µm. A thickness of the first bonding pad 62 and the second bonding pad 66 in the third direction (Z-direction) may be several µm.

In some embodiments, the width BW1 of the first bonding pad 62 in the second direction (Y-direction) may be greater than the width BW2 of the second bonding pad 66 in the second direction (Y-direction). In some embodiments, the first bonding pad 62 and the second bonding pad 66 may be a metal pad, for example, a copper pad.

An underfill layer 64 may be located on the signal wiring portion WIL between the first bonding pads 62. In some embodiments, the underfill layer 64 may be a resin layer. An insulating layer 68 may be located on the lower surface of the dummy substrate 40 between the second bonding pads 66. The insulating layer 68 may be a silicon oxide layer.

The first bonding pad 62 and the second bonding pad 66 of the integrated circuit semiconductor device 110 may be connected to the heat transfer line 28 and the heat transfer through via 14 via the upper multi-layer interconnect layers 26, 30, and 34 and the upper vias 32 and 36. The heat transfer through via 14 may be connected to the lower multi-layer interconnect layers 44, 48, 54, 58, and 59 and the lower vias 46, 50, 52, and 56 of the power delivery network portion PDN.

In the integrated circuit semiconductor device 110 configured as described above, heat generated in the cell portion CEL may be easily discharged to the outside via the heat transfer line 28, the signal wiring portion WIL, the first bonding pad 62, and the second bonding pad 66. Moreover, in the integrated circuit semiconductor device 110, heat generated in the cell portion CEL may be easily discharged to the outside via the heat transfer through via 14 and the power delivery network portion PDN.

Figure 6:
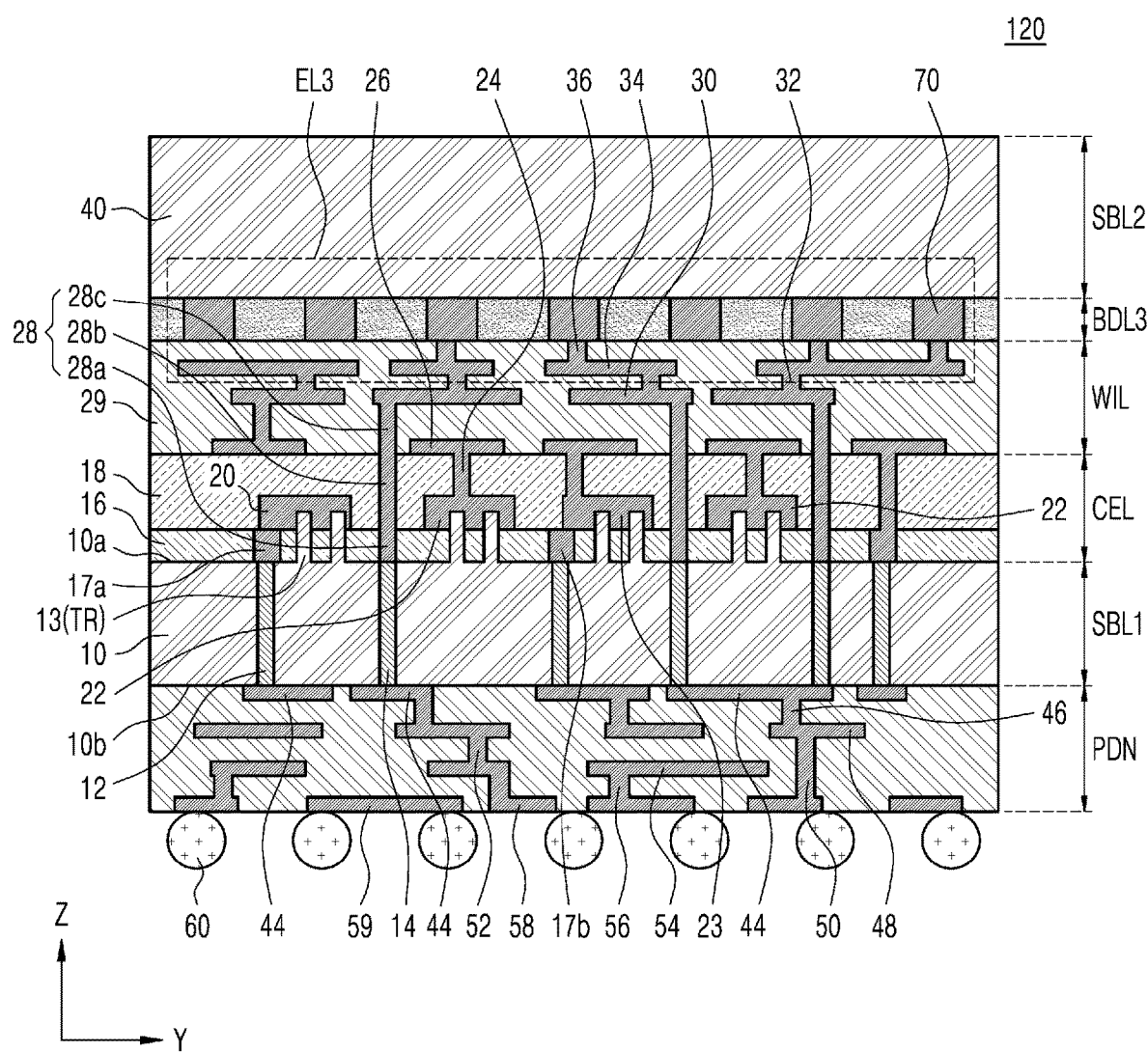
FIG. 6 is a cross-sectional view of a main portion of an integrated circuit semiconductor device according to an embodiment.
Figure 7:
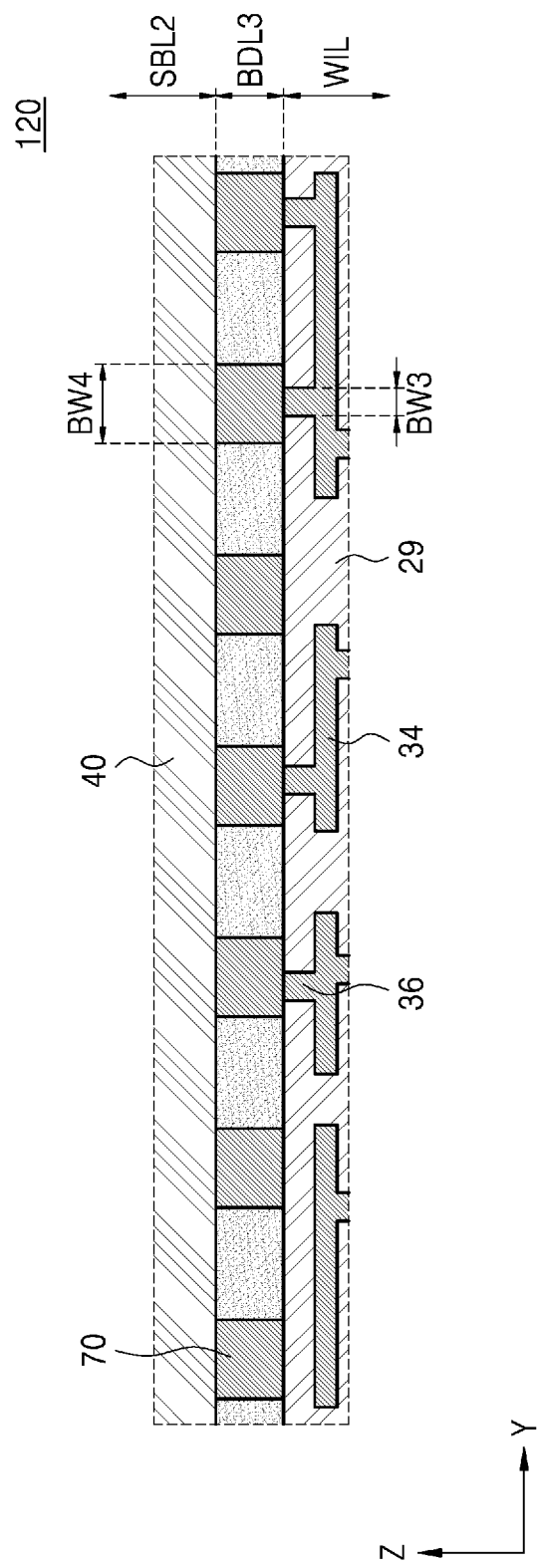
FIG. 7 is an enlarged partial view of FIG. 6.

FIG. 6 is a cross-sectional view of a main portion of an integrated circuit semiconductor device 120 according to an embodiment, and FIG. 7 is an enlarged partial view of FIG. 6.

In detail, FIG. 7 is an enlarged view of region "EL3" of FIG. 6. The integrated circuit semiconductor device 120 may be identical to the integrated circuit semiconductor device 100 of FIGS. 1 through 3 except that the integrated circuit semiconductor device 120 includes a third bonding portion BDL3. In FIGS. 6 and 7, like reference numerals as those of FIGS. 1 through 3 may denote like elements. In FIGS. 6 and 7, details that are identical to those provided with reference to FIGS. 1 through 3 will be briefly described or description thereof may be omitted.

The integrated circuit semiconductor device 120 may include the third bonding portion BDL3 bonding a signal wiring portion WIL to a dummy substrate 40 between the signal wiring portion WIL and the dummy substrate 40. The third bonding portion BDL3 may include a single bonding pad 70, in a vertical direction, that is on the lower surface of the dummy substrate 40 and bonded to the upper via 36 located in an uppermost portion from among the upper vias 32 and 36 of the signal wiring portion WIL. A set of single bonding pads 70 may be included. Each bonding pad of the set of single bonding pads 70 may connect to the dummy substrate 40 and the upper multi-layer interconnect layer of the signal wiring portion WIL. Each bonding pad of the set of single bonding pads 70 may have a single width and height.

In some embodiments, a width (or diameter) BW4 of each single bonding pad 70 in the second direction (Y-direction) may be greater than a width (or diameter) BW3 of the upper via 36 in the second direction (Y-direction).

In some embodiments, the width (or diameter) BW4 of each single bonding pad 70 in the second direction (Y-direction) may be several tens of µm. In some embodiments, the width (or diameter) BW3 of each upper via 36 in the second direction (Y-direction) may be several µm. A thickness of the single bonding pad 70 in the third direction (Z-direction) may be several µm.

In some embodiments, the single bonding pad 70 may be a metal pad, for example, a copper pad. The insulating layer 68 may be located on the signal wiring portion WIL between the single bonding pads 70. In some embodiments, the insulating layer 68 may be a silicon oxide layer.

The single bonding pad 70 of the integrated circuit semiconductor device 120 may be connected to the heat transfer line 28 and the heat transfer through via 14 via the upper multi-layer interconnect layers 26, 30, and 34 and the upper vias 32 and 36. The heat transfer through via 14 may be connected to the lower multi-layer interconnect layers 44, 48, 54, 58, and 59 and the lower vias 46, 50, 52, and 56 of the power delivery network portion PDN.

In the integrated circuit semiconductor device 120 configured as described above, heat generated in the cell portion CEL may be easily discharged to the outside via the heat transfer lines 28, the signal wiring portion WIL, and the single bonding pads 70. Moreover, in the integrated circuit semiconductor device 120, heat generated in the cell portion CEL may be easily discharged to the outside via the heat transfer through vias 14 and the power delivery network portion PDN.

Figure 8:
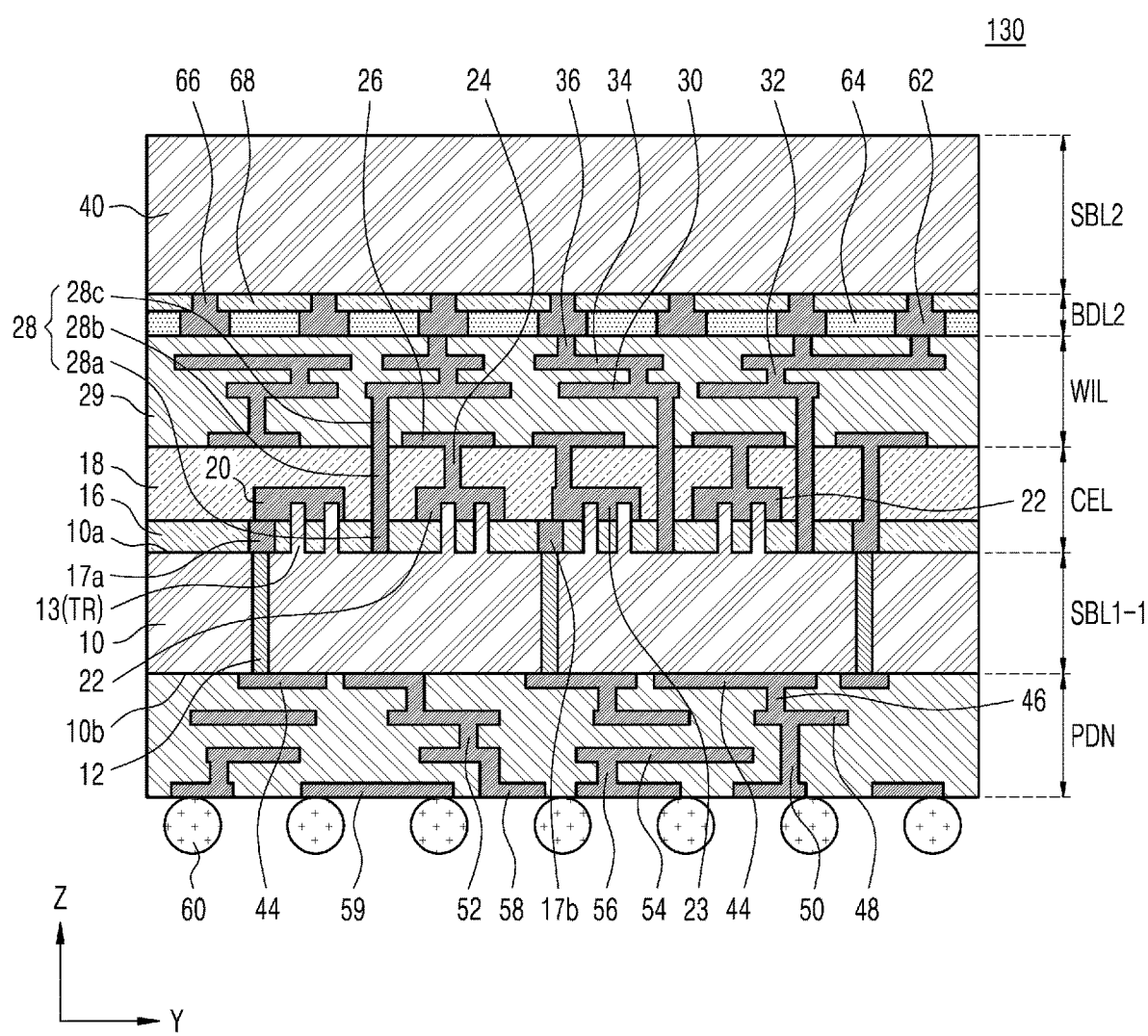
FIG. 8 is a cross-sectional view of a main portion of an integrated circuit semiconductor device according to an embodiment.

FIG. 8 is a cross-sectional view of a main portion of an integrated circuit semiconductor device 130 according to an embodiment.

In detail, the integrated circuit semiconductor device 130 may be identical to the integrated circuit semiconductor device 110 of FIGS. 4 and 5 except that the heat transfer through via 14 is not formed in a first substrate portion SBL1-1. In FIG. 8, like reference numerals as those of FIGS. 4 and 5 may denote like elements. In FIG. 8, details that are identical to those provided with reference to FIGS. 4 and 5 will be briefly described or description thereof may be omitted.

Compared to FIG. 4, in the integrated circuit semiconductor device 130, the heat transfer through via 14 is not formed in the first substrate portion SBL1-1. Heat generated in the cell portion CEL of the integrated circuit semiconductor device 130 may be discharged via the heat transfer line 28, the signal wiring portion WIL, the first bonding pad 62, and the second bonding pad 66.

As described above, in the integrated circuit semiconductor device 130, heat generated in the cell portion CEL may be easily discharged in an upward direction of the substrate 10, for example, via the signal wiring portion WIL and the second bonding portion BDL2.

Figure 9:
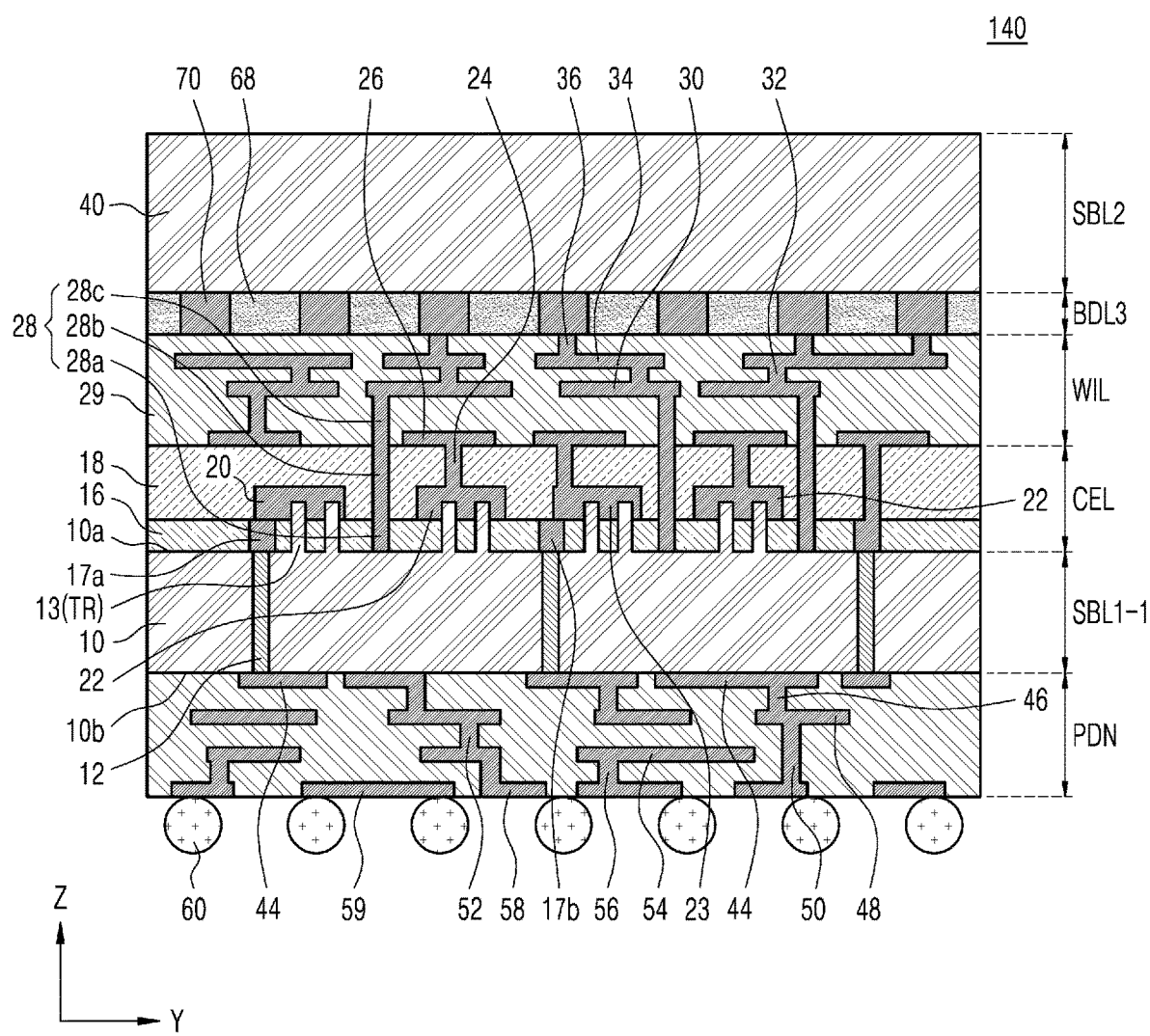
FIG. 9 is a cross-sectional view of a main portion of an integrated circuit semiconductor device according to an embodiment.

FIG. 9 is a cross-sectional view of a main portion of an integrated circuit semiconductor device 140 according to an embodiment.

In detail, the integrated circuit semiconductor device 140 may be identical to the integrated circuit semiconductor device 120 of FIGS. 6 and 7 except that the heat transfer through via 14 is not formed in the first substrate portion SBL1-1. In FIG. 9, like reference numerals as those of FIGS. 6 and 7 may denote like elements. In FIG. 9, details that are identical to those provided with reference to FIGS. 6 and 7 will be briefly described or description thereof may be omitted.

Compared to FIG. 6, in the integrated circuit semiconductor device 140, the heat transfer through via 14 is not formed in the first substrate portion SBL1-1. Heat generated in the cell portion CEL of the integrated circuit semiconductor device 140 may be discharged via the heat transfer line 28, the signal wiring portion WIL, and the single bonding pad 70. As described above, in the integrated circuit semiconductor device 140, heat generated in the cell portion CEL may be easily discharged in an upward direction of the substrate 10, for example, via the signal wiring portion WIL and the third bonding portion BDL3.

Figure 10:
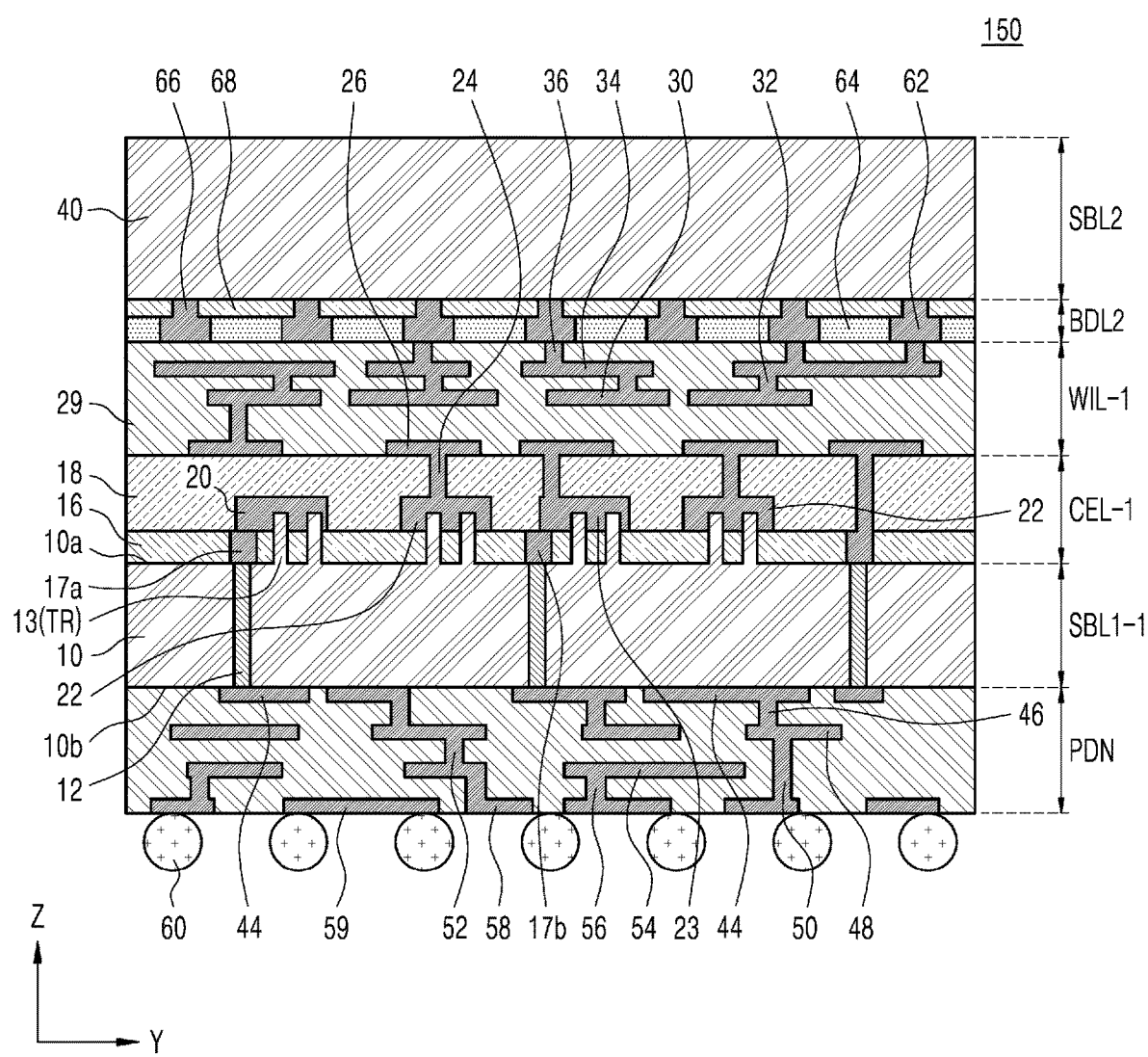
FIG. 10 is a cross-sectional view of a main portion of an integrated circuit semiconductor device according to an embodiment.

FIG. 10 is a cross-sectional view of a main portion of an integrated circuit semiconductor device 150 according to an embodiment.

In detail, the integrated circuit semiconductor device 150 may be identical to the integrated circuit semiconductor device 130 of FIG. 8 except that the heat transfer line 28 is not formed in a cell portion CEL-1 and a signal wiring portion WIL-1. In FIG. 10, like reference numerals as those of FIG. 8 may denote like elements. In FIG. 10, details that are identical to those provided with reference to FIG. 8 will be briefly described or description thereof may be omitted.

Compared to FIG. 8, in the integrated circuit semiconductor device 150, the heat transfer line 28 is not formed in the cell portion CEL-1 and the signal wiring portion WIL-1. Heat generated in the cell portion CEL-1 of the integrated circuit semiconductor device 150 may be discharged via the first bonding pad 62 and the second bonding pad 66. As described above, from the integrated circuit semiconductor device 150, heat generated in the cell portion CEL-1 may be easily discharged in an upward direction of the substrate 10, that is, via the second bonding portion BDL2.

Figure 11:
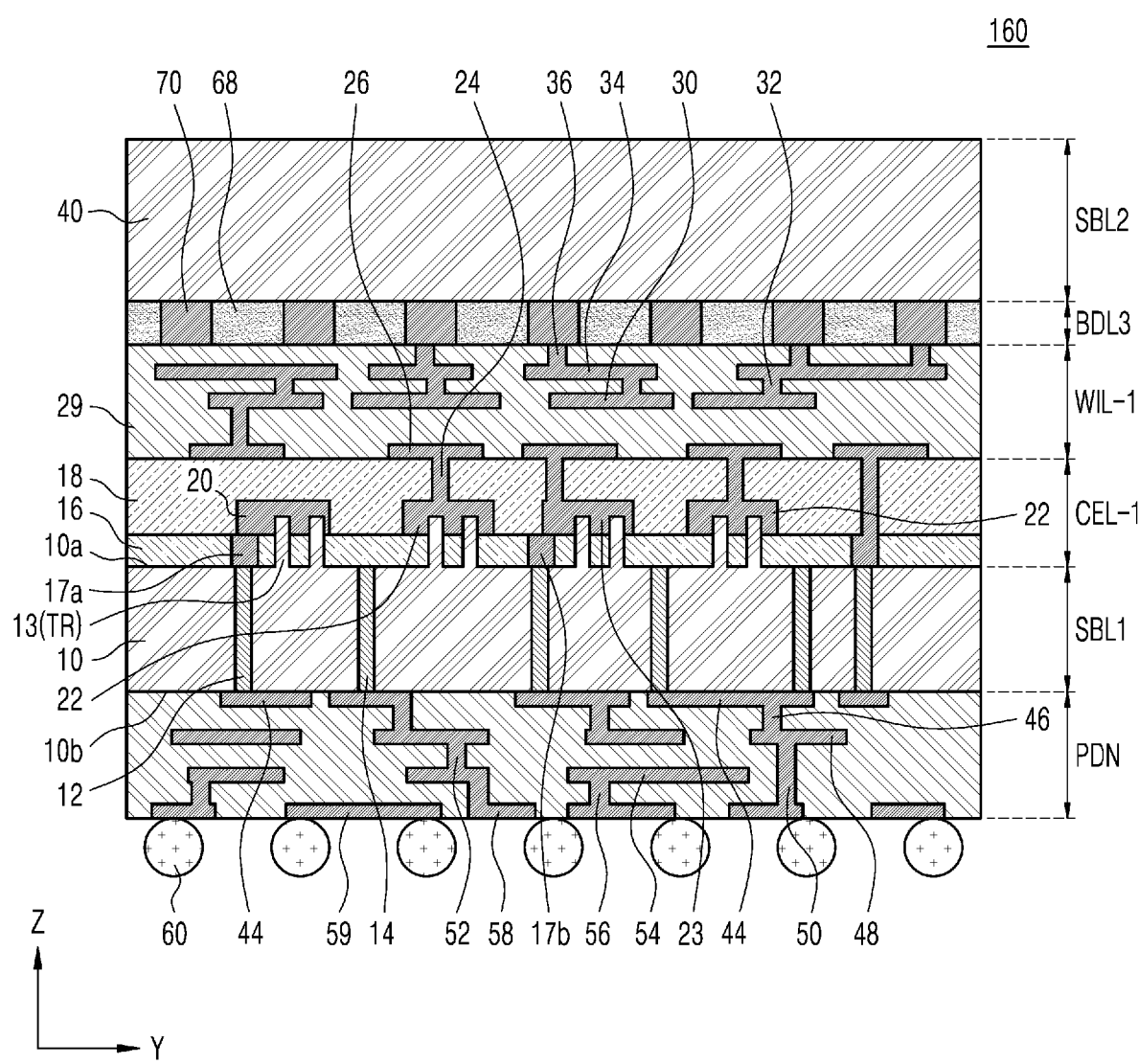
FIG. 11 is a cross-sectional view of a main portion of an integrated circuit semiconductor device according to an embodiment.

FIG. 11 is a cross-sectional view of a main portion of an integrated circuit semiconductor device 160 according to an embodiment.

In detail, the integrated circuit semiconductor device 160 may be identical to the integrated circuit semiconductor device 140 of FIG. 9 except that the heat transfer line 28 is not formed in the cell portion CEL-1 and the signal wiring portion WIL-1. In FIG. 11, like reference numerals as those of FIG. 9 may denote like elements. In FIG. 11, details that are identical to those provided with reference to FIG. 9 will be briefly described or description thereof may be omitted.

Compared to FIG. 9, in the integrated circuit semiconductor device 160, the heat transfer line 28 is not formed in the cell portion CEL-1 and the signal wiring portion WIL-1. Heat generated in the cell portion CEL-1 of the integrated circuit semiconductor device 160 may be discharged via the single bonding pad 70. As described above, from the integrated circuit semiconductor device 160, heat generated in the cell portion CEL-1 may be easily discharged in an upward direction of the substrate 10, for example, via the third bonding portion BDL3.

Figure 12:
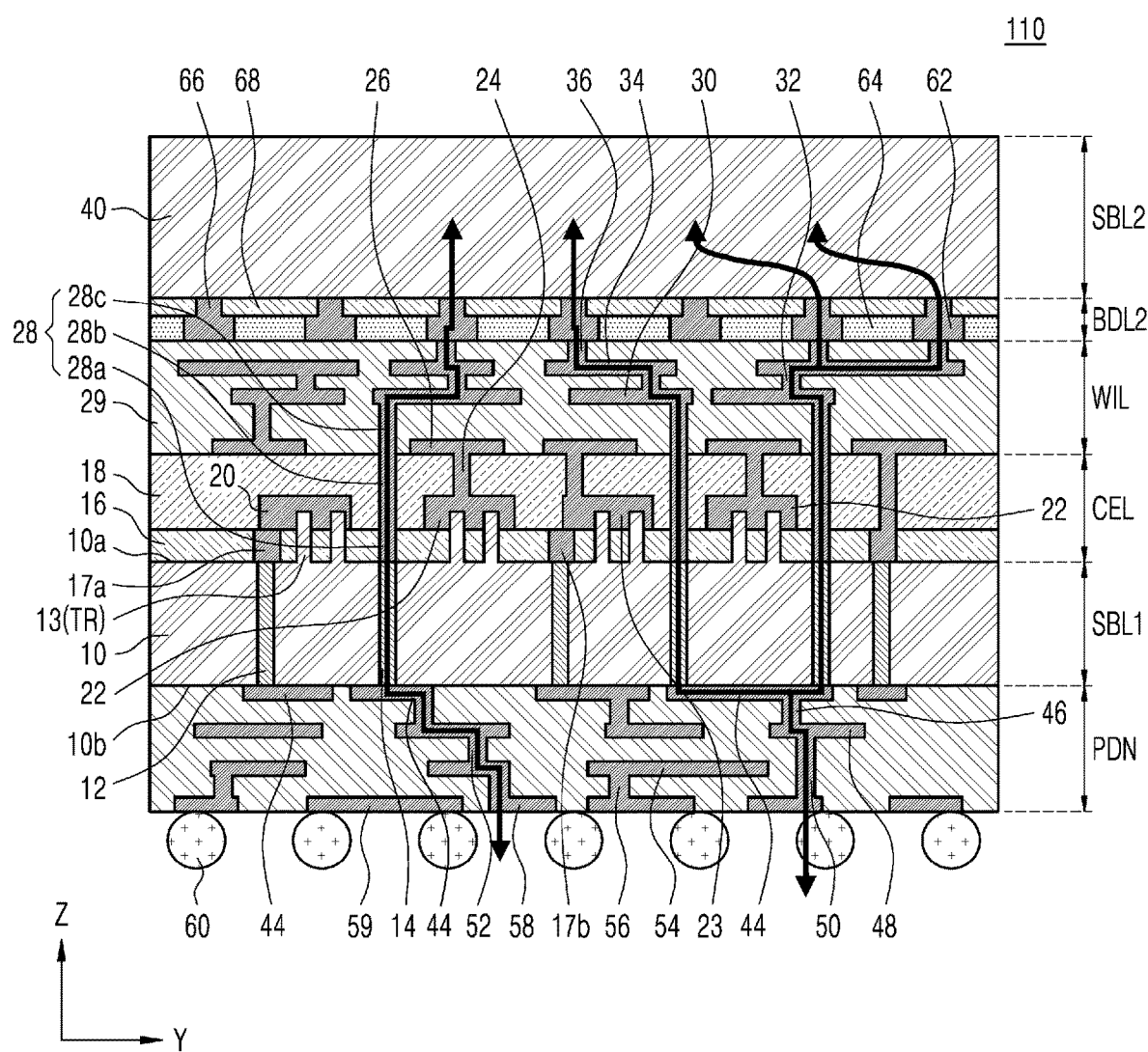
FIG. 12 is a diagram for describing a heat transfer path of an integrated circuit semiconductor device according to an embodiment.
Figure 13:
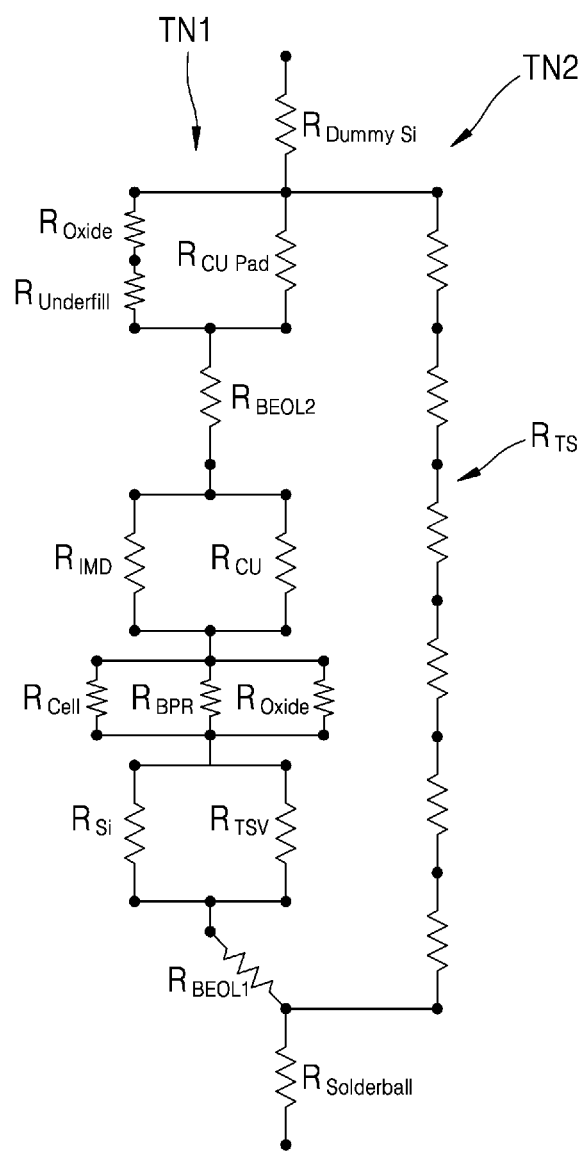
FIG. 13 illustrates a heat transfer path including thermal resistances of components of the integrated circuit semiconductor device of FIG. 12 according to an embodiment.

FIG. 12 is a diagram for describing a heat transfer path of an integrated circuit semiconductor device according to an embodiment, and FIG. 13 is a diagram illustrating a heat transfer path including thermal resistances of components of the integrated circuit semiconductor device of FIG. 12.

In detail, the heat transfer path will be described based on the integrated circuit semiconductor device 110 of FIG. 4. As illustrated in FIGS. 12 and 13, the integrated circuit semiconductor device 110 may include a first heat transfer path TN1 and a second heat transfer path TN2 between the external connection terminal 60 and the dummy substrate 40.

In the first heat transfer path TN1, heat may be transferred from the external connection terminal 60 to the second substrate portion SBL2 via the power delivery network portion PDN, the first substrate portion SBL1, the cell portion CEL, the signal wiring portion WIL, and the second bonding portion BDL2. Here, thermal resistances of individual elements constituting the first heat transfer path TN1 will be described by referring to FIG. 13.

In FIG. 13, $R_{solderball}$ denotes a thermal resistance of the external connection terminal 60, for example, a thermal resistance of a solder ball, and $R_{BEOL1}$ denotes a thermal resistance of the power delivery network portion PDN (e.g., the combined conductive interconnect layers and vias). $R_{si}$ denotes a thermal resistance of the substrate 10, and $R_{TSV}$ denotes a thermal resistance of the rail through via 12. $R_{cell}$ denotes a thermal resistance of the active fin 13, $R_{BPR}$ denotes a thermal resistance of the buried rails 17a and 17b, and $R_{oxide}$ denotes a thermal resistance of the device isolation insulating layer 16.

In addition, $R_{IMD}$ denotes a thermal resistance of the interlayer insulating layer 18, and $R_{cu}$ denotes thermal resistances of the local interconnects 20, 22, and 23 and the cell via 24. $R_{BEOL2}$ denotes a thermal resistance of the signal wiring portion WIL (e.g., the combined conductive interconnect layers and vias). $R_{Underfill}$ denotes a thermal resistance of the underfill layer 64, and $R_{Oxide}$ denotes a thermal resistance of the insulating layer 68, $R_{CuPad}$ denotes a thermal resistance of the first and second bonding pads 62 and 66, and $R_{Dummy\ Si}$ denotes a thermal resistance of the dummy substrate 40.

As described above, the integrated circuit semiconductor device 110 may include the second heat transfer path TN2. The second heat transfer path TN2 may include a transfer thermal resistance RN between the external connection terminal 60 and the dummy substrate 40. Thermal resistance refers to a resistance to transfer of heat. A lower thermal resistance will transfer heat more easily and quickly.

The second heat transfer path TN2 may be a path through which heat is transferred from the external connection terminal 60 to the dummy substrate 40 via the lower multi-layer interconnect layers 44, 48, 54, 58, and 59, the lower vias 46, 50, 52, and 56, the heat transfer through via 14, the heat transfer line 28, the upper multi-layer interconnect layers 26, 30, and 34, the upper vias 32 and 36, the first bonding pad 62, and the second bonding pad 66. These may be, for example, components having lower heat resistance than, for example, substrate 10, device isolation insulating layer 16, interlayer insulating layer 18, upper interconnect insulation layer 29, underfill layer 64, and insulating layer 68.

Also, the second heat transfer path TN2 may be a path through which heat is transferred from the dummy substrate 40 to the external connection terminal 60 via the second bonding pad 66, the first bonding pad 62, the heat transfer line 28, the heat transfer through via 14, the lower multi-layer interconnect layers 44, 48, 54, 58, and 59, and the lower vias 46, 50, 52, and 56.

The transfer thermal resistance $R_{TS}$ may be a thermal resistance resulting from the lower multi-layer interconnect layers 44, 48, 54, 58, and 59, the lower vias 46, 50, 52, and 56, the heat transfer through via 14 and the heat transfer line 28, the upper multi-layer interconnect layers 26, 30, and 34, the upper vias 32 and 36, and the first and second bonding pads 62 and 64. As described above, as the integrated circuit semiconductor device 110 further includes the second heat transfer path TN2 having the transfer thermal resistance $R_{TS}$, heat may be effectively discharged therefrom.

FIGS. 14 through 17 are cross-sectional views illustrating a method of manufacturing an integrated circuit semiconductor device according to an embodiment.

Figure 14:
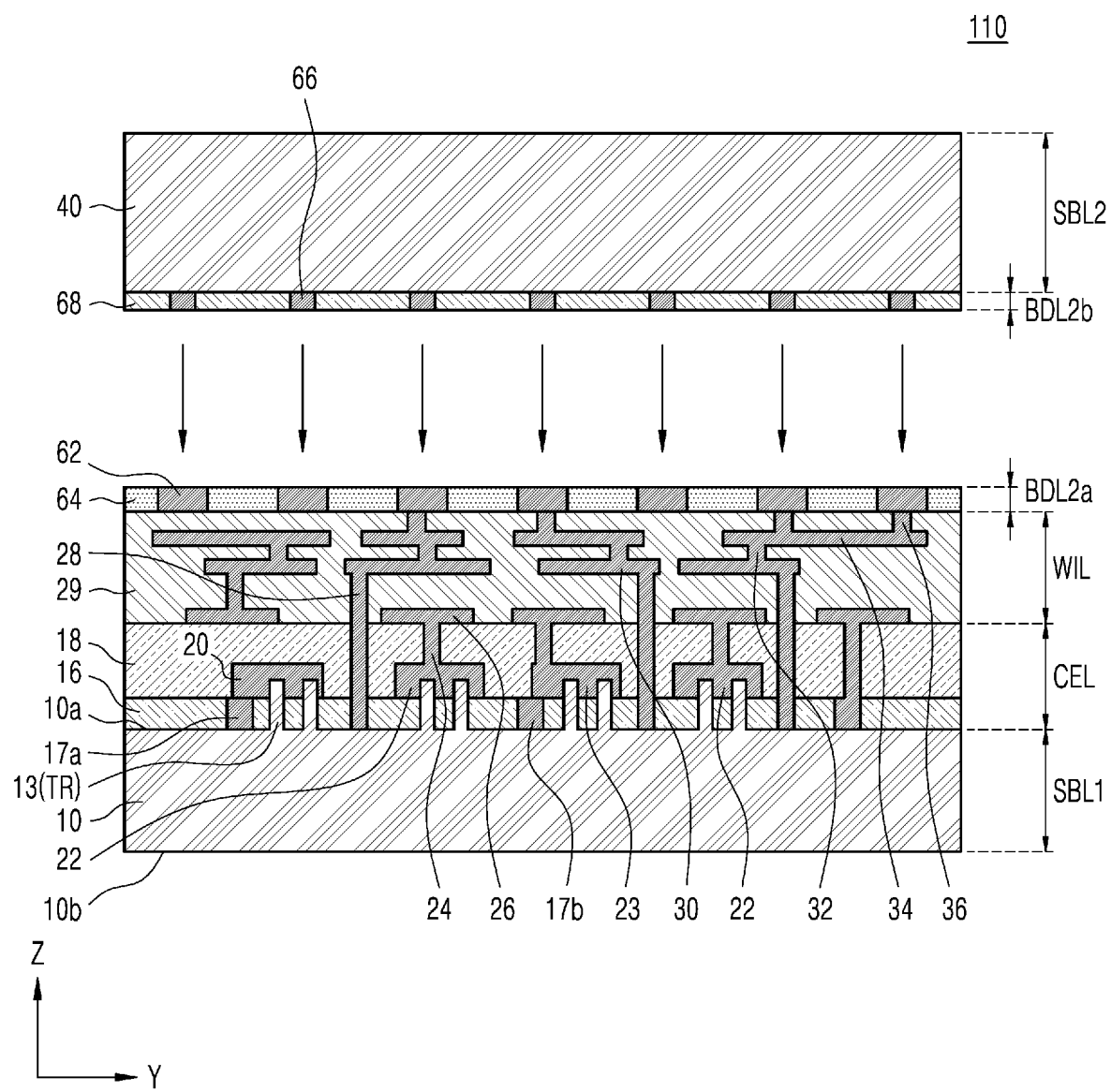
FIGS. 14 through 17 are cross-sectional views illustrating a method of manufacturing an integrated circuit semiconductor device according to an embodiment.

In detail, FIGS. 14 through 17 are provided to describe a method of manufacturing the integrated circuit semiconductor device 110 of FIGS. 4 and 5. In FIGS. 14 through 17, like reference numerals as those of FIGS. 4 and 5 may denote like elements. In FIG. 14, details that are identical to those provided with reference to FIGS. 4 and 5 will be briefly described or description thereof may be omitted.

Referring to FIG. 14, the cell portion CEL and the signal wiring portion WIL are formed on the first surface 10a of the substrate 10, for example, on the front surface. In some embodiments, the substrate 10 may have a thickness of about several hundreds μm or less. As described above, the cell portion CEL may include the buried rails 17a and 17b, the local interconnects 20, 22, and 23, the cell via 24, and the transistor TR.

The signal wiring portion WIL may include the upper multi-layer interconnect layers 26, 30, and 34 and the upper vias 32 and 36. The upper multi-layer interconnect layers 26, 30, and 34 and the upper vias 32 and 36 may be formed, for example, using a damascene process. In the cell portion CEL and the signal wiring portion WIL, the heat transfer line 28 connected to the upper multi-layer interconnect layers 26, 30, and 34 is formed.

A first substrate side-bonding portion BDL2a is formed on the signal wiring portion WIL. Forming of the first substrate side-bonding portion BDL2a includes forming the first bonding pads 62 on the signal wiring portion WIL. The first bonding pads 62 may be insulated from each other via the underfill layer 64 on the signal wiring portion WIL. The first bonding pads 62 may be connected to the upper multi-layer interconnect layers 26, 30, and 34 and the upper vias 32 and 36. The first bonding pads 62 may be connected to the upper multi-layer interconnect layers 26, 30, and 34 via the upper vias 32 and 36.

A second substrate side-bonding portion BDL2b is formed on the lower surface of the dummy substrate 40. Forming of the second substrate side-bonding portion BDL2b includes forming the second bonding pads 66 on the lower surface of the dummy substrate 40. The second bonding pads 66 may be insulated from each other via the insulating layer 68.

The first bonding pads 62 of the first substrate side-bonding portion BDL2a and the second bonding pads 66 of the second substrate side-bonding portion BDL2b are arranged to face each other to bond them to each other. As the first bonding pads 62 and the second bonding pads 66 are bonded to each other, the second bonding portion BDL2 (FIG. 15) is formed. The bonding may be, for example, direct metal-to-metal bonding, such as Cu—Cu bonding.

Figure 15:
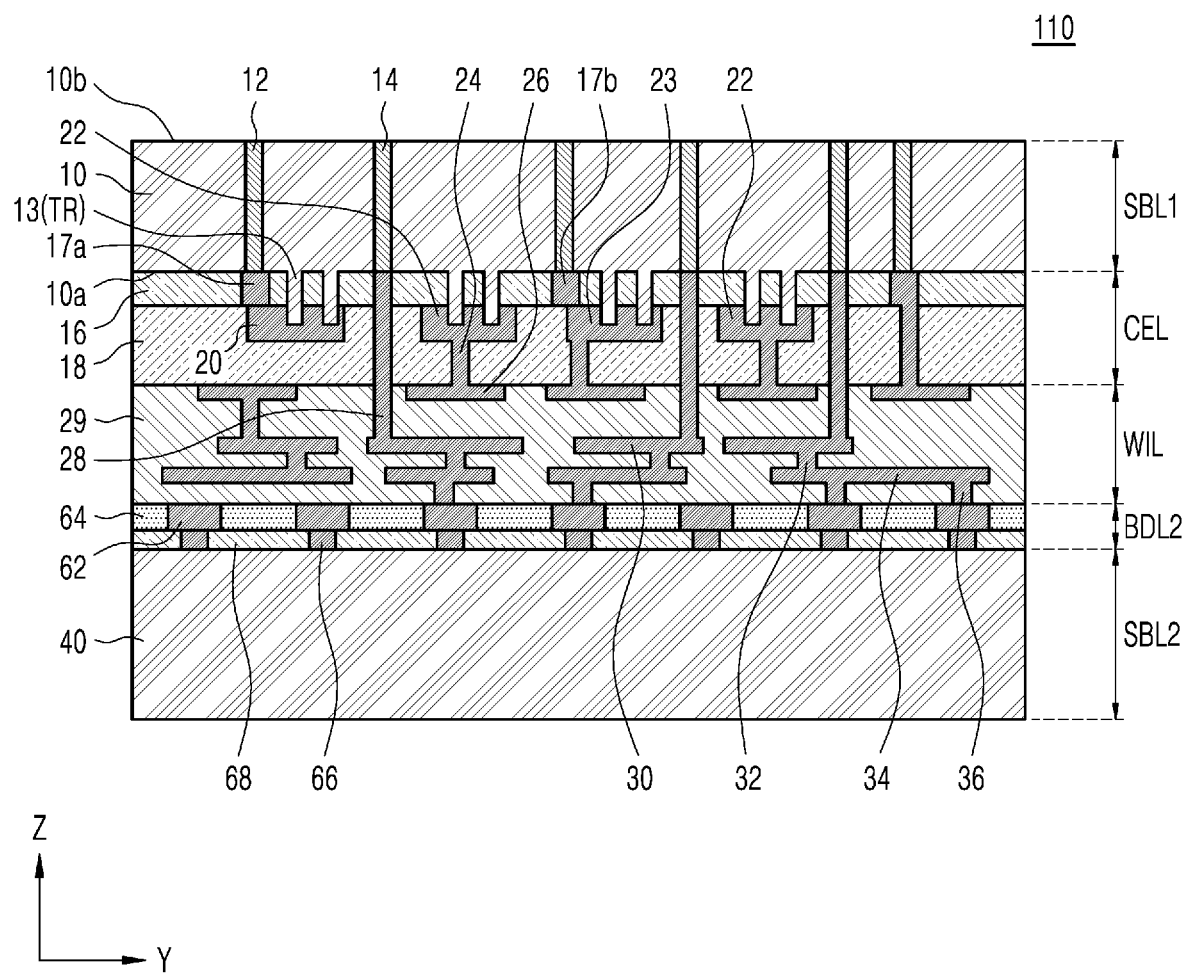

Referring to FIG. 15, the dummy substrate 40 is turned upside down to position the dummy substrate 40 in a lower portion of the integrated circuit semiconductor device 110. Accordingly, the second surface 10b of the substrate 10, for example, the back surface (or a rear surface), is located in an upper portion of the integrated circuit semiconductor device 110. According to necessity, the second surface 10b of the substrate 10 may be reduced in thickness by performing chemical mechanical polishing thereon, and in this case, the substrate 10 may have a thickness of several μm.

The rail through vias 12 and the heat transfer through vias 14 are formed on the second surface 10b of the substrate 10. The rail through vias 12 and the heat transfer through vias 14 may pass between the second surface 10b and the first surface 10a of the substrate 10. The rail through vias 12 are formed to be connected to the buried rails 17a and 17b. The heat transfer through vias 14 is connected to the heat transfer lines 28.

Figure 16:
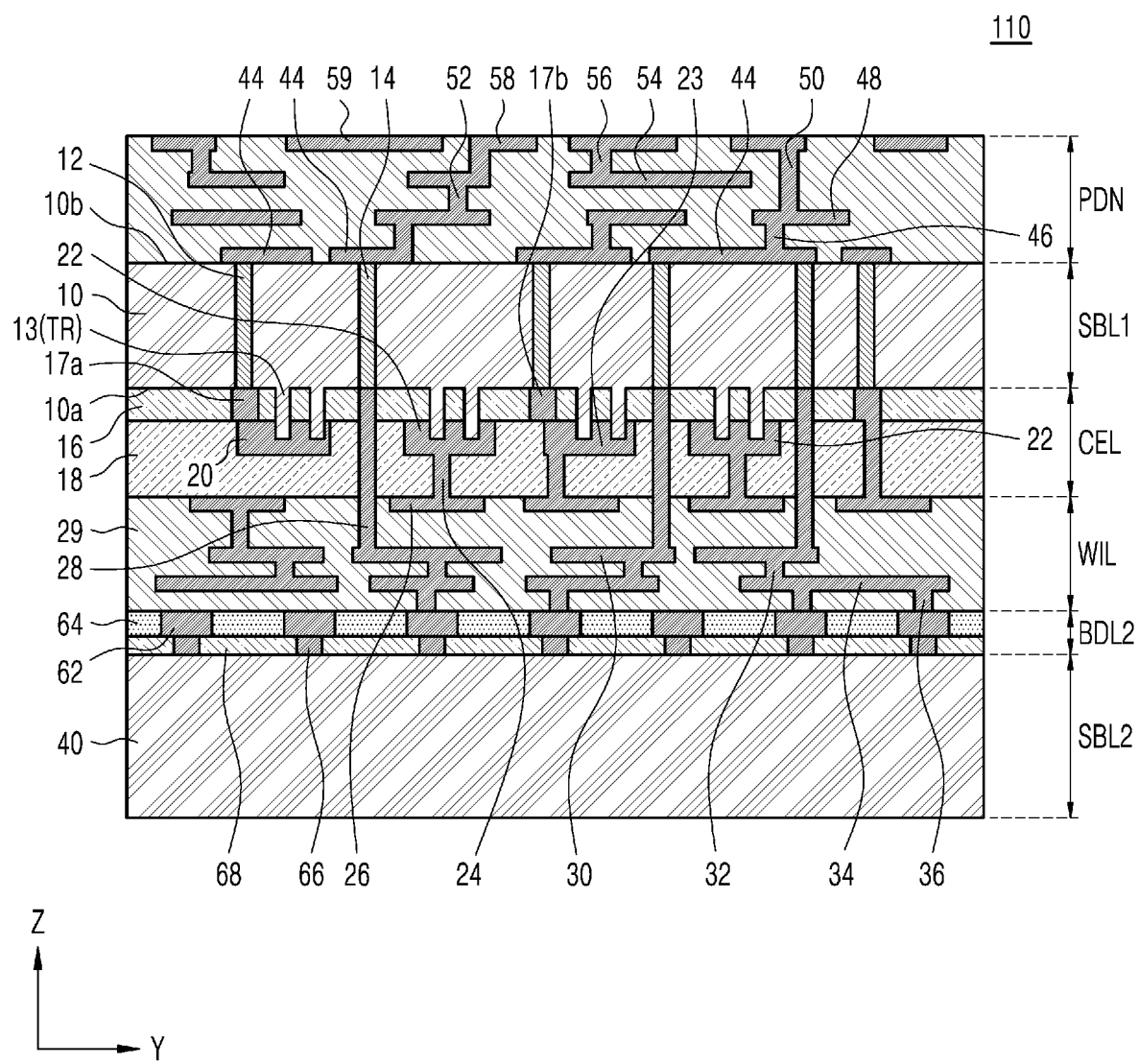

Referring to FIG. 16, the power delivery network portion PDN is formed on the second surface 10b of the substrate 10 on which the rail through vias 12 and the heat transfer through vias 14 are formed. The power delivery network portion PDN includes the lower multi-layer interconnect layers 44, 48, 54, 58, and 59 and the lower vias 46, 50, 52, and 56 that are connected to the rail through vias 12. The lower multi-layer interconnect layers 44, 48, 54, 58, and 59 and the lower vias 46, 50, 52, and 56 may be formed, for example, using a damascene process.

Moreover, in the power delivery network portion PDN, the lower multi-layer interconnect layers 44, 48, 54, 58, and 59 and the lower vias 46, 50, 52, and 56 connected to the heat transfer through vias 14 are formed.

Figure 17:
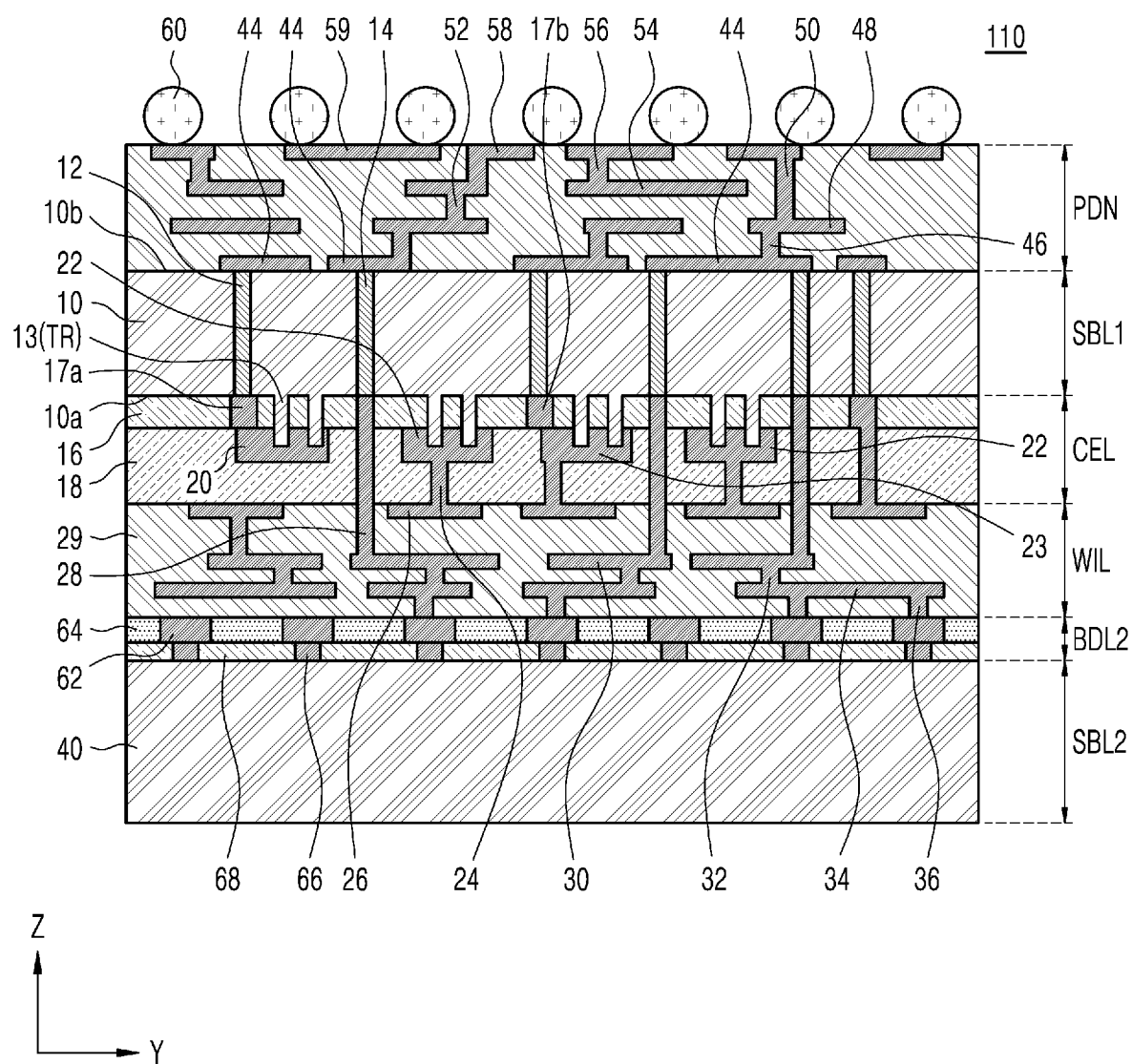

Referring to FIG. 17, the external connection terminal 60 connected to the lower multi-layer interconnect layers 44, 48, 54, 58, and 59 and the lower vias 46, 50, 52, and 56 is formed on the power delivery network portion PDN and the integrated circuit semiconductor device 110 is completely manufactured.

Figure 18:
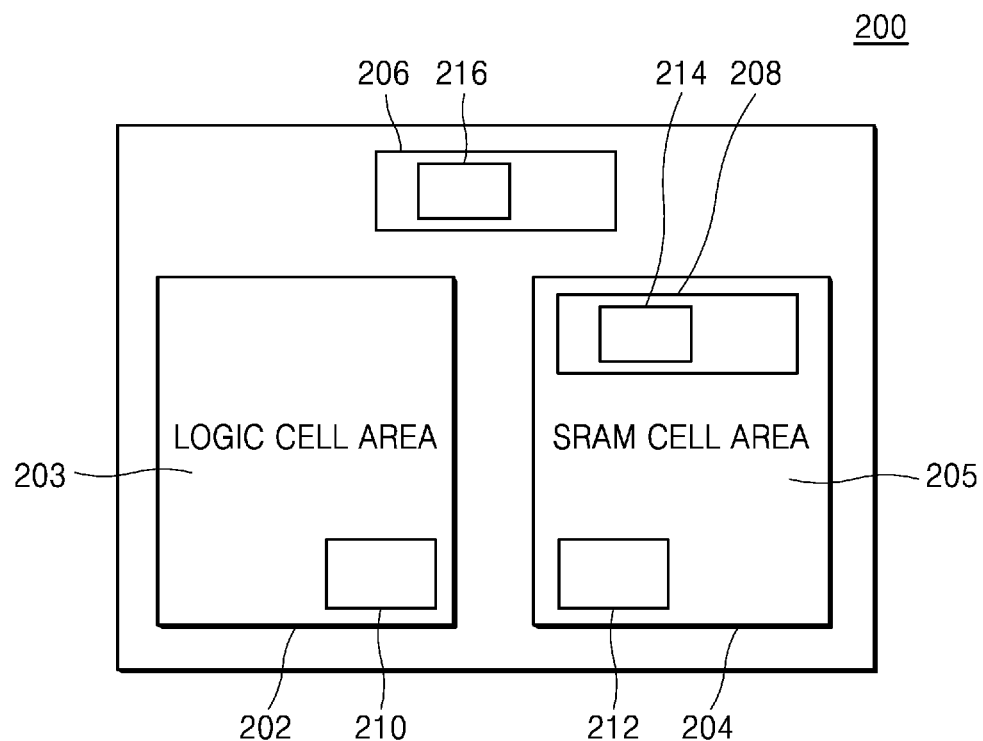
FIG. 18 is a block diagram illustrating a configuration of a semiconductor chip including an integrated circuit semiconductor device, according to some embodiments.

FIG. 18 is a block diagram illustrating a configuration of a semiconductor chip 200 including an integrated circuit semiconductor device, according to embodiments.

In detail, the semiconductor chip 200 may include a logic area 202, an SRAM area 204, and an input/output area 206. The logic area 202 may include a logic cell area 203. The SRAM area 204 may include an SRAM cell area 205 and an SRAM peripheral circuit area 208. In the logic cell area 203, a first transistor 210 may be arranged, and in the SRAM cell area 205, a second transistor 212 may be arranged. In the SRAM peripheral circuit area 208, a third transistor 214 may be formed, and in the input/output area 206, a fourth transistor 216 may be arranged.

The semiconductor chip 200 may include the integrated circuit semiconductor device 100, 110, 120, 130, 140, 150, or 160 according to the embodiments of the inventive concept. In some embodiments, the first transistor 210, the second transistor 212, the third transistor 214, and the fourth transistor 216 may include a finFET (or a fin-type transistor) such as described above.

Figure 19:
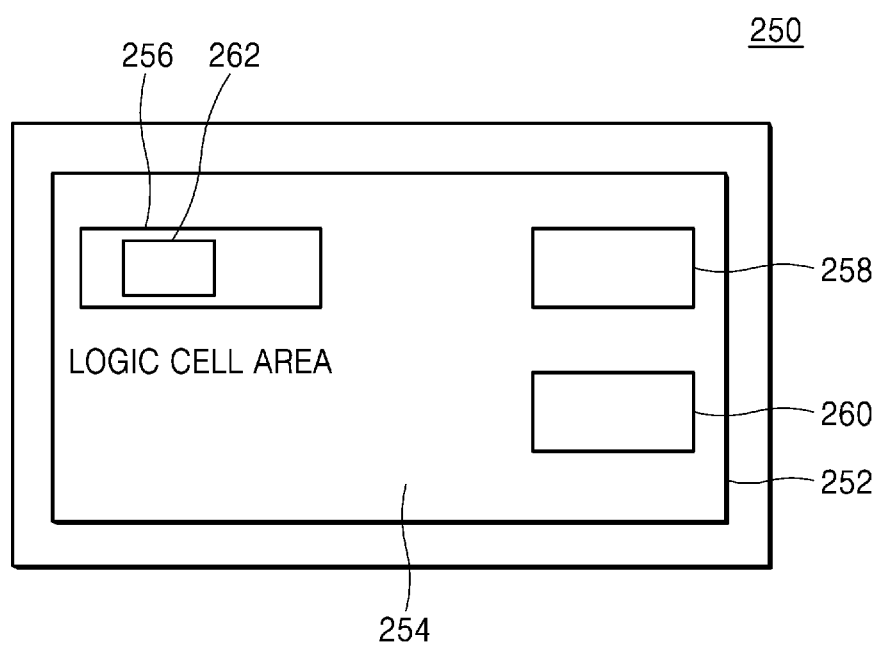
FIG. 19 is a block diagram illustrating a configuration of a semiconductor chip including an integrated circuit semiconductor device, according to some embodiments.

FIG. 19 is a block diagram illustrating a configuration of a semiconductor chip 250 including an integrated circuit semiconductor device, according to embodiments.

In detail, the semiconductor chip 250 may include a logic area 252. The logic area 252 may include a logic cell area 254 and an input/output area 256. In the logic cell area 254, a first transistor 258 and a second transistor 260 may be arranged. The first transistor 258 and the second transistor 260 may have different conductivity types. In the input/output area 256, a third transistor 262 may be arranged.

The semiconductor chip 250 may include the integrated circuit semiconductor device 100, 110, 120, 130, 140, 150, or 160 according to the embodiments of the inventive concept. In some embodiments, the first transistor 258, the second transistor 260, and the third transistor 262 may include a fin FET (fin-type transistor) such as described above.

Figure 20:
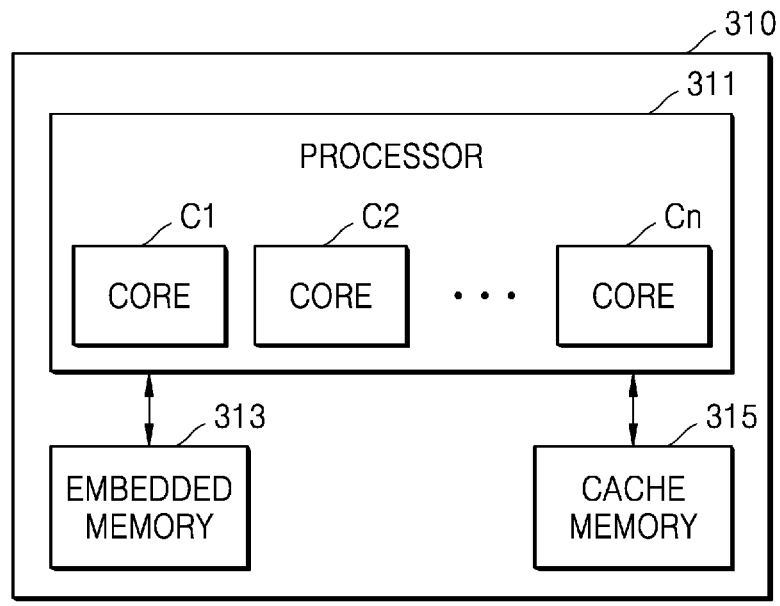
FIG. 20 is a block diagram illustrating a configuration of an electronic device including an integrated circuit semiconductor device, according to some embodiments.

FIG. 20 is a block diagram illustrating a configuration of an electronic device 300 including an integrated circuit semiconductor device, according to embodiments.

In detail, the electronic device 300 may be a system-on-chip 310. The system-on-chip 310 may include a processor 311, an embedded memory 313, and a cache memory 315. The processor 311 may include one or more processor cores C1 through Cn (n is a positive integer). The processor cores C1 through Cn may process data and signals. The processor cores C1 through Cn may include the integrated circuit semiconductor devices 100, 110, 120, 130, 140, 150, and 160 according to the embodiments.

The electronic device 300 may perform its unique functions by using processed data and signals. For example, the processor 311 may be an application processor. The embedded memory 313 may exchange first data DAT1 with the processor 311. The first data DAT1 is data that is processed or is to be processed by the processor cores C1 through Cn. The embedded memory 313 may control the first data DAT1. For example, the embedded memory 313 may buffer the first data DAT1. The embedded memory 313 may operate as a buffer memory or a working memory of the processor 311.

The embedded memory 313 may be SRAM. SRAM may operate faster than DRAM. When SRAM is embedded in the system-on-chip 310, the electronic device 300 having a compact size and operating at a high speed may be implemented. Furthermore, when SRAM is embedded in the system-on-chip 310, consumption of active power of the electronic device 300 may be reduced.

For example, SRAM may include an integrated circuit semiconductor device according to the embodiments. The cache memory 315 may be mounted on the system-on-chip 310, together with the processor cores C1 through Cn. The cache memory 315 may store cache data DATc. The cache data DATc may be data used by the processor cores C1 through Cn. The cache memory 315 has a small storage capacity but may operate at a high speed.

For example, the cache memory 315 may include SRAM including an integrated circuit semiconductor device according to the embodiments. When the cache memory 315 is used, the number of times and a period of time that the processor 311 accesses the embedded memory 313 may be reduced. Accordingly, when the cache memory 315 is used, an operating speed of the electronic device 300 may be increased. The cache memory 315 is illustrated as a separate component from the processor 311 for better understanding. However, the cache memory 315 may also be configured to be included in the processor 311.

Figure 21:
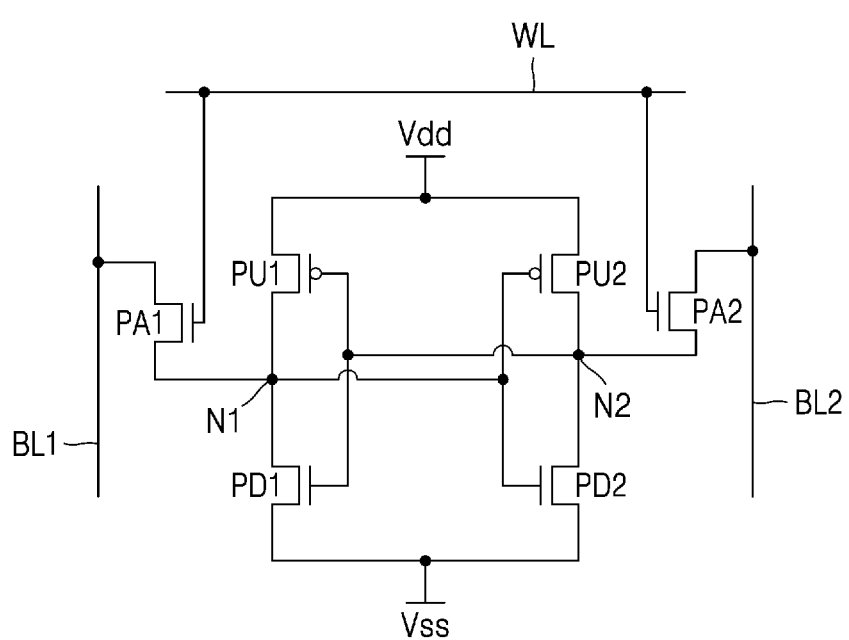
FIG. 21 is an equivalent circuit diagram illustrating a static random access memory (SRAM) cell according to some embodiments.

FIG. 21 is an equivalent circuit diagram illustrating an SRAM cell according to embodiments.

In detail, the SRAM cell may be implemented using the integrated circuit semiconductor device 100, 110, 120, 130, 140, 150, or 160 according to the embodiments. For example, the SRAM cell may be applied to the embedded memory 313 and/or the cache memory 315 described above with reference to FIG. 20.

The SRAM cell may include a first pull-up transistor PU1, a first pull-down transistor PD1, a second pull-up transistor PU2, a second pull-down transistor PD2, a first access transistor PA1, and a second access transistor PA2.

The first and second pull-up transistors PU1 and PU2 may be P-type MOS transistors, whereas the first and second pull-down transistors PD1 and PD2 and the first and second access transistors PA1 and PA2 may be N-type MOS transistors.

The first pull-up transistor PU1 and the first pull-down transistor PD1 may constitute a first inverter. Gate electrodes (gates) of the first pull-up and first pull-down transistors PU1 and PD1, the gate electrodes being connected to each other, may correspond to an input end of the first inverter, and a first node N1 may correspond to an output end of the first inverter.

The second pull-up transistor PU2 and the second pull-down transistor PD2 may constitute a second inverter. Gate electrodes (gates) of the second pull-up and second pull-down transistors PU2 and PD2, the gate electrodes being connected to each other, may correspond to an input end of the second inverter, and a second node N2 may correspond to an output end of the second inverter.

The first and second inverters may be combined to constitute a latch structure. The gate electrodes of the first pull-up and first pull-down transistors PU1 and PD1 may be electrically connected to the second node N2, and the gate electrodes of the second pull-up and second pull-down transistors PU2 and PD2 may be electrically connected to the first node N1.

A first source/drain of the first access transistor PA1 may be connected to the first node N1, and a second source/drain of the first access transistor PA1 may be connected to a first bit line BL1. A first source/drain of the second access transistor PA2 may be connected to the second node N2, and a second source/drain of the second access transistor PA2 may be connected to a second bit line BL2.

Gate electrodes of the first and second access transistors PA1 and PA2 may be electrically connected to a word line WL. Accordingly, an SRAM cell may be implemented using the integrated circuit semiconductor device 100, 110, 120, 130, 140, 150, or 160 according to the embodiments of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit semiconductor device comprising:
   a substrate having a first surface and a second surface opposite the first surface;
   a rail through via passing between the first surface and the second surface of the substrate;
   a cell-level portion arranged on the first surface and including a buried rail connected to the rail through via, a local conductive interconnect, a cell via connected to the local conductive interconnect, and a transistor connected to the local conductive interconnect;
   a signal wiring-level portion arranged on the cell-level portion and comprising an upper multi-layer interconnect layer connected to the local conductive interconnect via the cell via;
   a heat transfer line connected to the upper multi-layer interconnect layer and formed in the cell-level portion and the signal wiring-level portion;
   a dummy substrate arranged on the signal wiring-level portion;
   a bonding-level portion arranged between the signal wiring-level portion and the dummy substrate and bonding the signal wiring-level portion to the dummy substrate;
   a power delivery network-level portion arranged under the second surface of the substrate and comprising a lower multi-layer interconnect layer connected to the rail through via; and
   an external connection terminal arranged under the power delivery network-level portion and connected to the lower multi-layer interconnect layer.

2. The integrated circuit semiconductor device of claim 1, wherein the first surface comprises a front surface of the substrate and the second surface comprises a back surface of the substrate.

3. The integrated circuit semiconductor device of claim 1, wherein the buried rail comprises one of a power rail, a ground rail, and a signal rail.

4. The integrated circuit semiconductor device of claim 1, wherein a width of the buried rail is greater than a width of the rail through via.

5. The integrated circuit semiconductor device of claim 1, wherein the transistor comprises a fin field-effect transistor (finFET), and the local conductive interconnect surrounds a portion of an upper portion of an active fin constituting the finFET.

6. The integrated circuit semiconductor device of claim 1, wherein the bonding-level portion comprises a first bonding pad that is on the signal wiring-level portion and connected to the upper multi-layer interconnect layer and a second bonding pad formed on a lower surface of the dummy substrate and bonded to the first bonding pad.

7. The integrated circuit semiconductor device of claim 1, wherein the bonding-level portion comprises a set of single bonding pads, each connected to the dummy substrate and the upper multi-layer interconnect layer of the signal wiring-level portion.

8. The integrated circuit semiconductor device of claim 7, further comprising a heat transfer path in which the heat transfer line, the upper multi-layer interconnect layer, and one of the single bonding pads are all connected in a direction from the signal wiring-level portion toward the dummy substrate.

9. The integrated circuit semiconductor device of claim 1, further comprising a heat transfer through via passing between the first surface and the second surface of the substrate, wherein the heat transfer through via is connected to the heat transfer line and the lower multi-layer interconnect layer.

10. The integrated circuit semiconductor device of claim 9, wherein the bonding-level portion comprises a first bonding pad that is located on the signal wiring-level portion and connected to the heat transfer line and the upper multi-layer interconnect layer and a second bonding pad that is on a lower surface of the dummy substrate and bonded to the first bonding pad.

11. The integrated circuit semiconductor device of claim 9, wherein the bonding-level portion comprises a set of single bonding pads that are located directly between the dummy substrate and the signal wiring-level portion and are connected to the heat transfer line and the upper multi-layer interconnect layer.

12. An integrated circuit semiconductor device comprising:
   a first substrate having a first surface and a second surface opposite the first surface;
   a first through via passing from the first surface to the second surface of the first substrate;
   a heat transfer through via arranged apart from the first through via and passing from the first surface to the second surface of the first substrate;
   a cell-level portion arranged on the first surface of the first substrate and comprising a buried conductor connected to the first through via, a local conductive interconnect, a cell via connected to the local conductive interconnect, and a transistor connected to the local conductive interconnect;
   a signal wiring-level portion arranged on the cell-level portion and comprising a plurality of upper multi-layer interconnect layers connected to the local conductive interconnect via the cell via and upper vias connecting the upper multi-layer interconnect layers to each other;
   a heat transfer line connected to the heat transfer through via and the upper multi-layer interconnect layers, the heat transfer line formed in the cell-level portion and the signal wiring-level portion;
   a second substrate arranged on the signal wiring-level portion;
   a bonding-level portion arranged between the signal wiring-level portion and the second substrate and bonding the signal wiring-level portion to the second substrate, and comprising a bonding pad connected to an upper via of the upper vias;
   a power delivery network-level portion arranged under the second surface of the first substrate and comprising a plurality of lower multi-layer interconnect layers connected to the first through via and lower vias connecting the lower multi-layer interconnect layers to each other; and an external connection terminal arranged under the power delivery network-level portion and connected to the lower multi-layer interconnect layers.

13. The integrated circuit semiconductor device of claim 12, wherein the bonding pad comprises a first bonding pad having a first width and that is arranged on the signal wiring-level portion and connected to the upper via and a second bonding pad having a second width different from the first width and arranged under the second substrate and bonded to the first bonding pad.

14. The integrated circuit semiconductor device of claim 12, wherein the bonding pad comprises a single bonding pad arranged on the signal wiring-level portion and connected to the upper via.

15. The integrated circuit semiconductor device of claim 12, wherein the second substrate is a dummy substrate.

16. The integrated circuit semiconductor device of claim 12, further comprising a heat transfer path in which the lower multi-layer interconnect layers, the lower vias, the heat transfer through via, the heat transfer line, the upper multi-layer interconnect layers, the upper vias, and the bonding pad are all connected in a direction from the external connection terminal toward the second substrate.

17. The integrated circuit semiconductor device of claim 12, wherein the buried conductor comprises one of a power rail, a ground rail, and a signal rail, and is arranged on the first substrate to extend in a first direction, and the local conductive interconnect is arranged on the first substrate to extend in a second direction perpendicular to the first direction.

18. An integrated circuit semiconductor device comprising:
   a substrate having a first surface and a second surface opposite the first surface;
   a rail through via passing between the first surface and the second surface of the substrate;
   a cell-level portion arranged on the first surface and comprising a buried rail connected to the rail through via, a local conductive interconnect, a cell via connected to the local conductive interconnect, and a transistor connected to the local conductive interconnect;
   a signal wiring-level portion arranged on the cell-level portion and comprising a plurality of upper multi-layer interconnect layers connected to the local conductive interconnect via the cell via and upper vias connecting the upper multi-layer interconnect layers to each other;
   a dummy substrate arranged on the signal wiring-level portion;
   a bonding-level portion arranged between the signal wiring-level portion and the dummy substrate and bonding the signal wiring-level portion to the dummy substrate, and comprising a bonding pad connected to an upper via of the upper vias;
   a power delivery network-level portion arranged under the second surface of the substrate and comprising a plurality of lower multi-layer interconnect layers connected to the rail through via and lower vias connecting the lower multi-layer interconnect layers to each other; and
   an external connection terminal arranged under the power delivery network-level portion and connected to the lower multi-layer interconnect layers.

19. The integrated circuit semiconductor device of claim 18, wherein the bonding pad comprises a first bonding pad that is arranged on the signal wiring-level portion, has a first width, and is connected to an upper via of the upper vias, and a second bonding pad that is arranged under the dummy substrate and is bonded to the first bonding pad.

20. The integrated circuit semiconductor device of claim 18, wherein the bonding pad comprises a bonding pad arranged on the signal wiring-level portion, connected to an upper via of the upper vias, and having a single width between a top surface of the signal wiring-level portion and the dummy substrate.

* * * * *